United States Patent
Landry et al.

(10) Patent No.: US 11,953,959 B1
(45) Date of Patent: Apr. 9, 2024

(54) HYBRID APPARATUSES FOR MINING CRYPTOCURRENCY AND METHODS OF OPERATING THE SAME

(71) Applicant: Hestia Heating Incorporated, Labrador City (CA)

(72) Inventors: Joel Landry, Grand Lake (CA); Christopher Wayne Searle, Labrador City (CA); Robert Walter Burton, Labrador City (CA); Curtis John Doran, Labrador City (CA)

(73) Assignee: Hestia Heating Incorporated, Labrador City (CA)

( * ) Notice: Subject to any disclaimer, the term of this patent is extended or adjusted under 35 U.S.C. 154(b) by 0 days.

(21) Appl. No.: 18/446,797

(22) Filed: Aug. 9, 2023

Related U.S. Application Data

(63) Continuation of application No. 18/446,714, filed on Aug. 9, 2023.

(51) Int. Cl.
 *G06F 1/20* (2006.01)
 *G05D 23/19* (2006.01)
 *H05K 7/20* (2006.01)

(52) U.S. Cl.
 CPC ......... *G06F 1/206* (2013.01); *G05D 23/1917* (2013.01); *H05K 7/20* (2013.01)

(58) Field of Classification Search
 CPC ....................................................... G06F 1/206
 See application file for complete search history.

(56) References Cited

U.S. PATENT DOCUMENTS

| | | |
|---|---|---|
| 8,522,569 B2 | 9/2013 | Avery et al. |
| 9,408,333 B2 | 8/2016 | Aso et al. |
| 9,743,559 B2 | 8/2017 | Ryu et al. |
| 10,394,290 B2 | 8/2019 | Hardin |
| 10,608,433 B1 | 3/2020 | McNamara et al. |
| 11,130,422 B1 | 9/2021 | Goldfarb et al. |
| 11,574,372 B2 | 2/2023 | Barbour |

(Continued)

FOREIGN PATENT DOCUMENTS

| | | |
|---|---|---|
| GB | 2582309 A | 9/2020 |
| WO | 2022184923 A1 | 9/2022 |

(Continued)

OTHER PUBLICATIONS

Donovan et al., Is crypto mining the next home heating trend?, Feb. 8, 2022, Capital.com, pp. 10 (Year: 2022).*

(Continued)

*Primary Examiner* — Suresh Suryawanshi
(74) *Attorney, Agent, or Firm* — BERESKIN & PARR LLP/ S.E.N.C.R.L. s.r.l; Nicholas Aitken

(57) ABSTRACT

A hybrid apparatus for charging electric vehicles and mining cryptocurrency is provided. The apparatus may comprise an electric power input associated with a rated maximum power capacity, an electric vehicle charger, a cryptocurrency miner and a power coordinator. The electric vehicle charger may have at least one vehicle power outlet and a maximum charger power draw from the electric power input. The cryptocurrency miner may have multiple cryptocurrency mining computers and a maximum miner power draw from the electric power input. Each mining computer may have an adjustable intensity level. The power coordinator may be configured to determine mining power availability within the rated maximum power capacity after prioritizing power demand by the electric vehicle charger, and to direct the cryptocurrency miner to continue mining cryptocurrency by adjusting the intensity levels of the mining computers such that the cryptocurrency miner consumes not more than the mining power availability.

15 Claims, 17 Drawing Sheets

(56) References Cited

U.S. PATENT DOCUMENTS

| | | | |
|---|---|---|---|
| 11,638,364 B1* | 4/2023 | Landry | H05K 7/20145 |
| | | | 361/679.49 |
| 11,659,682 B2 | 5/2023 | Barbour | |
| 2011/0240281 A1 | 10/2011 | Avery | |
| 2014/0307384 A1 | 10/2014 | Best | |
| 2018/0004175 A1* | 1/2018 | Halikias | G05D 13/62 |
| 2018/0005326 A1* | 1/2018 | Reid | G06Q 10/06315 |
| 2021/0018968 A1 | 1/2021 | Leung et al. | |
| 2021/0027223 A1 | 1/2021 | Koide | |
| 2021/0141429 A1 | 5/2021 | Larocque | |
| 2021/0192619 A1* | 6/2021 | Wu | G06F 1/20 |
| 2021/0271299 A1 | 9/2021 | Gauthier et al. | |
| 2021/0318735 A1 | 10/2021 | Barbour | |
| 2022/0300394 A1* | 9/2022 | Webber | G06F 1/3209 |
| 2022/0407727 A1 | 12/2022 | Uysal | |
| 2023/0037377 A1 | 2/2023 | Fresa | |
| 2023/0062168 A1* | 3/2023 | Logan | G06Q 20/065 |
| 2023/0208138 A1* | 6/2023 | McNamara | G06Q 50/06 |
| | | | 713/310 |

FOREIGN PATENT DOCUMENTS

| | | |
|---|---|---|
| WO | 2022254236 A1 | 12/2022 |
| WO | 2023052817 A1 | 4/2023 |
| WO | 2023130175 A1 | 7/2023 |

OTHER PUBLICATIONS

Romain Dillet, Qarnot unveils a cryptocurrency heater for your home, Mar. 8, 2018, Join TechCrunch+, pp. 11 (Year: 2018).*

Chaim Gartenberg, This cryptocurrency mining rig can also heat your home, Mar. 9, 2018, Bitcoin Tech Gadgets, pp. 5 (Year: 2018).*

Matti Lehtonen, Hedging Investments of Grid-Connected PV-BESS in Buildings Using Cryptocurrency Mining: A case Study in Finland, May 31, 2023, IEEE Power & Energy Society Section, pp. 19 (Year: 2023).*

Barbour "Ohmm Black Box" Upstream Data, retrieved on Jul. 17, 2023.

Barbour "Ohmm Hash Hut" Upstream Data, retrieved on Jul. 17, 2023.

Barbour "Ohmm Mini" Upstream Data, retrieved on Jul. 17, 2023.

"Daymak to Launch CryptoSolarTree, World's First Emission-Free Crypto Mining Solution and Most Versatile Green-Energy System", Globe Newswire, Nov. 3, 2021 <https://www.globenewswire.com/en/news-release/2021/11/03/2326206/0/en/Daymak-to-Launch-CryptoSolarTree-World-s-First-Emission-Free-Crypto-Mining-Solution-and-Most-Versatile-Green-Energy-System.html>.

* cited by examiner

HYBRID APPARATUSES FOR MINING CRYPTOCURRENCY AND METHODS OF OPERATING THE SAME

CROSS REFERENCE TO RELATED APPLICATION

This application is a continuation of U.S. patent application Ser. No. 18/446,714, filed Aug. 9, 2023, the entire contents of which are hereby incorporated by reference.

FIELD

This document relates to hybrid apparatuses for mining cryptocurrency and methods of operating the hybrid apparatuses. The hybrid apparatuses may include cryptocurrency mining furnaces and/or electric vehicle (EV) chargers.

BACKGROUND

Cryptocurrency is a type of virtual asset that is protected using cryptography. Cryptocurrencies, such as Bitcoin, use blockchain technology to record transactions involving the cryptocurrency in a blockchain ledger. Cryptocurrency mining includes the processes by which new cryptocurrency tokens are discovered and entered into circulation and the process of verifying new cryptocurrency transactions to prevent the "double-spending problem" in which a cryptocurrency owner illicitly spends the same cryptocurrency token more than once. A cryptocurrency miner may receive revenue by mining new coins or by receiving transaction fees for verifying new cryptocurrency transactions (e.g., Bitcoin average transaction fee (BATF) for verifying new Bitcoin transactions). The transaction fees may vary based on network congestion, e.g., the transaction fees may increase when larger number of new transactions need to be verified and/or fewer cryptocurrency mining resources are available for transaction verification. Accordingly, cryptocurrency mining forms a critical component of the blockchain ledger's maintenance and development process.

During cryptocurrency mining operations, cryptocurrency transactions are typically verified by solving a complex computational math problem. For example, during Bitcoin mining operations, a bitcoin miner attempts to come up with a 64-digit hexadecimal number (a "hash") that is equal to a target hash. The first bitcoin miner to compute the target hash or the closest value to it receives the next block of bitcoins and the process begins again. Bitcoin miners receive bitcoins as a reward for completing "blocks" of verified transactions, which are added to the blockchain.

Cryptocurrency mining operations require significant computational effort that is typically performed using specialized computing hardware and consumes large amounts of electrical energy and generates large amounts of heat. This process is also known as proof of work (PoW) and cryptocurrency mining includes engaging in this PoW activity to solve the problem and receive cryptocurrency tokens (e.g., in Bitcoins).

SUMMARY

The following summary is provided to introduce the reader to the more detailed discussion to follow. The summary is not intended to limit or define any claimed or as yet unclaimed invention. One or more inventions may reside in any combination or sub-combination of the elements or process steps disclosed in any part of this document including its claims and figures.

According to some aspects, a hybrid apparatus for charging electric vehicles and mining cryptocurrency is provided. The apparatus may comprise an electric power input, an electric vehicle charger, a cryptocurrency miner and a power coordinator. The electric power input may be associated with a rated maximum power capacity. The electric vehicle charger may be electrically connected to the electric power input. The electric vehicle charger may have at least one vehicle power outlet and a maximum charger power draw from the electric power input. The maximum charger power draw may be associated with delivering a maximum charger output to the at least one vehicle power outlet and be less than the rated maximum power capacity. The cryptocurrency miner may be electrically connected to the electric power input. The cryptocurrency miner may have multiple cryptocurrency mining computers and a maximum miner power draw from the electric power input. Each mining computer may have an adjustable intensity level. The maximum miner power draw may be associated with the multiple cryptocurrency mining computers each operating at their respective highest intensity level. The maximum miner power draw may be less than the rated maximum power capacity. The power coordinator may be configured to determine mining power availability within the rated maximum power capacity after prioritizing power demand by the electric vehicle charger, and to direct the cryptocurrency miner to continue mining cryptocurrency by adjusting the intensity levels of the mining computers such that the cryptocurrency miner consumes not more than the mining power availability, wherein the rated maximum power capacity is between 40% and 80% of a sum of the maximum charger power draw and the maximum miner power draw.

According to some aspects, a mesh network system of cryptocurrency mining furnaces is provided. The mesh network system may comprise at least three cryptocurrency mining furnaces including a first, second, and third cryptocurrency mining furnace. Each cryptocurrency mining furnace may have multiple cryptocurrency mining computers, a building heat outlet duct thermally coupled to heat generated by the mining computers and a wireless radio. The first cryptocurrency mining furnace may have a network interface card having a network wire connector supporting connectivity to an internet source to exchange cryptocurrency mining data. The wireless radio of the first cryptocurrency mining furnace may support interconnectivity with the second and third cryptocurrency mining furnaces. The second cryptocurrency mining furnace may be configured to exchange cryptocurrency mining data with the network interface card by way of the wireless radios of the first and second cryptocurrency mining furnaces. The third cryptocurrency mining furnace may be configured to exchange cryptocurrency mining data with the network interface card by way of the wireless radios of the first, second, and third cryptocurrency mining furnaces.

According to some aspects, a cryptocurrency mining furnace is provided. The cryptocurrency mining furnace may comprise an electric power input, a cryptocurrency miner, a building heat outlet duct, and a power coordinator. The cryptocurrency miner may be electrically connected to the electric power input. The cryptocurrency miner may have multiple cryptocurrency mining computers, each mining computer having an adjustable intensity level. The building heat outlet duct may be thermally coupled to heat generated by the cryptocurrency mining computers. The power coordinator may be configured to receive a target furnace heating level, and adjust the intensity levels of the mining computers such that the cryptocurrency mining furnace operates at no higher than the target furnace heating level.

According to some aspects, a method of coordinating power between an electric vehicle charger and a cryptocurrency miner is provided. The method may comprise powering the cryptocurrency miner, wherein the cryptocurrency miner has multiple cryptocurrency mining computers and a maximum miner power draw, each mining computer having an adjustable intensity level, the maximum miner power draw being associated with the multiple cryptocurrency mining computers each operating at their respective highest intensity level; detecting connection of an electric vehicle to the electric vehicle charger, the connection associated with a vehicle charging power demand; determining, by a power coordinator, mining power availability for the cryptocurrency miner after prioritizing power demand by the electric vehicle charger, wherein the mining power availability is less than 70% of the maximum miner power draw; directing, by the power coordinator, the cryptocurrency miner to continue mining cryptocurrency by adjusting the intensity levels of the mining computers such that the cryptocurrency miner consumes not more than the mining power availability; and supplying electric power to the electric vehicle, via the electric vehicle charger, in response to the vehicle charging power demand.

According to some aspects, a non-transitory computer readable medium may be provided. The medium may store thereon program instructions that are executable by a processor for performing any of the methods described herein.

BRIEF DESCRIPTION OF THE DRAWINGS

The drawings included herewith are for illustrating various examples of articles, methods, and apparatuses of the present specification and are not intended to limit the scope of what is taught in any way. In the drawings.

DETAILED DESCRIPTION

Figure 1:
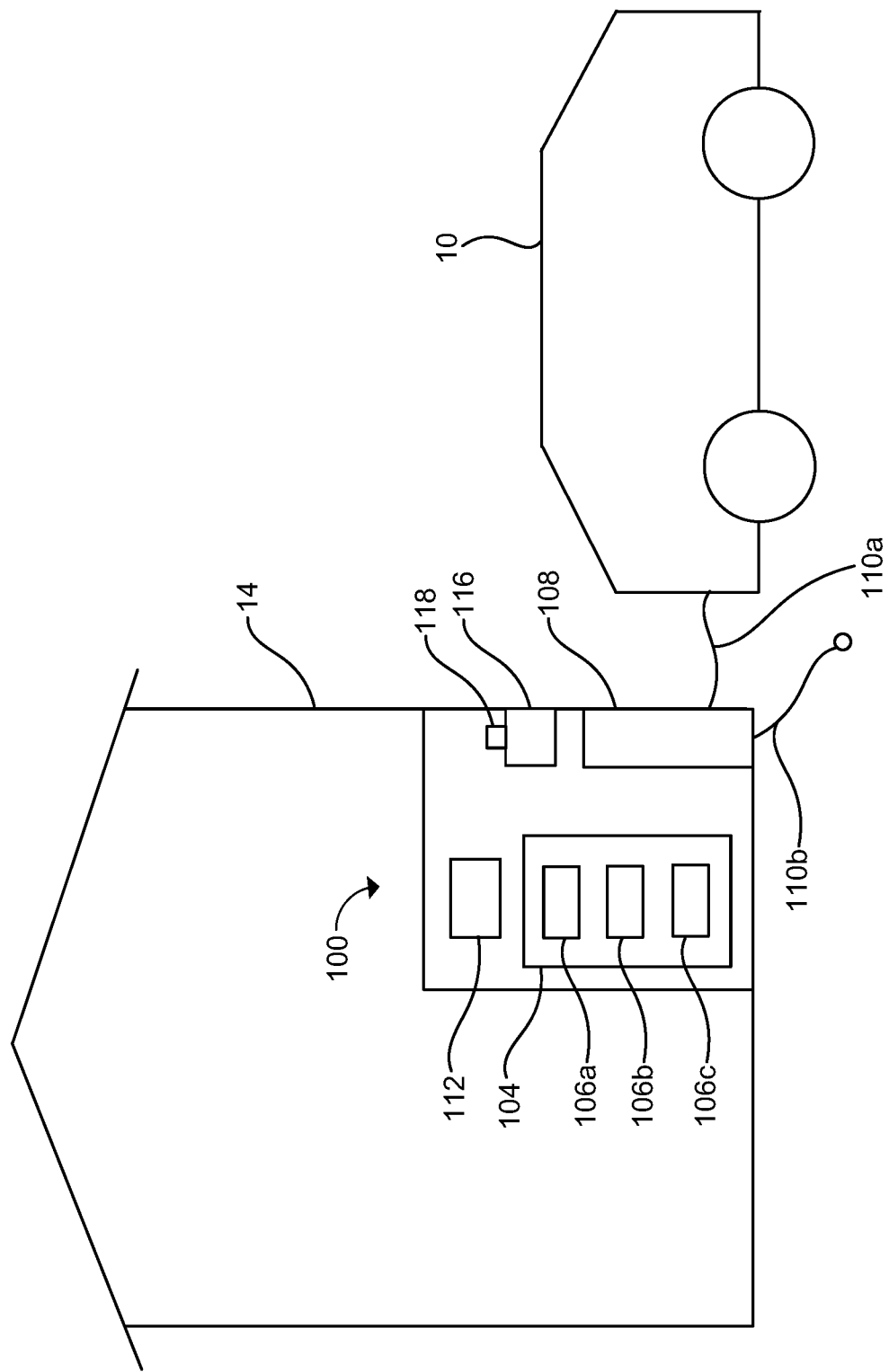
FIG. 1 is a schematic illustration of an example hybrid apparatus that includes a cryptocurrency miner and an EV charger, in accordance with an embodiment.

Numerous embodiments are described in this application and are presented for illustrative purposes only. The described embodiments are not intended to be limiting in any sense. The invention is widely applicable to numerous embodiments, as is readily apparent from the disclosure herein. Those skilled in the art will recognize that the present invention may be practiced with modification and alteration without departing from the teachings disclosed herein. Although particular features of the present invention may be described with reference to one or more particular embodiments or figures, it should be understood that such features are not limited to usage in the one or more particular embodiments or figures with reference to which they are described.

The terms "an embodiment," "embodiment," "embodiments," "the embodiment," "the embodiments," "one or more embodiments," "some embodiments," and "one embodiment" mean "one or more (but not all) embodiments of the present invention(s)," unless expressly specified otherwise.

The terms "including," "comprising" and variations thereof mean "including but not limited to," unless expressly specified otherwise. A listing of items does not imply that any or all of the items are mutually exclusive, unless expressly specified otherwise. The terms "a," "an" and "the" mean "one or more," unless expressly specified otherwise.

As used herein and in the claims, two or more parts are said to be "coupled", "connected", "attached", "joined", "affixed", or "fastened" where the parts are joined or operate together either directly or indirectly (i.e., through one or more intermediate parts), so long as a link occurs. As used herein and in the claims, two or more parts are said to be "directly coupled", "directly connected", "directly attached", "directly joined", "directly affixed", or "directly fastened" where the parts are connected in physical contact with each other. As used herein, two or more parts are said to be "rigidly coupled", "rigidly connected", "rigidly attached", "rigidly joined", "rigidly affixed", or "rigidly fastened" where the parts are coupled so as to move as one while maintaining a constant orientation relative to each other. None of the terms "coupled", "connected", "attached", "joined", "affixed", and "fastened" distinguish the manner in which two or more parts are joined together.

Further, although steps of methods may be described (in the disclosure and/or in the claims) in a sequential order, such methods may be configured to work in alternate orders. In other words, any sequence or order of steps that may be described does not necessarily indicate a requirement that the steps be performed in that order. The steps of methods described herein may be performed in any order that is practical. Further, some steps may be performed simultaneously.

As used herein and in the claims, a group of elements are said to 'collectively' perform an act where that act is performed by any one of the elements in the group, or performed cooperatively by two or more (or all) elements in the group.

It should also be noted that, as used herein, the wording "and/or" is intended to represent an inclusive-or. That is, "X and/or Y" is intended to mean X or Y or both X and Y, for example. As a further example, "X, Y, and/or Z" is intended to mean X or Y or Z or any combination thereof.

As used herein and in the claims, a first element is said to be "received" in a second element where at least a portion of the first element is received in the second element unless specifically stated otherwise.

Some elements herein may be identified by a part number, which is composed of a base number followed by an alphabetical or subscript-numerical suffix (e.g., 112a, or $112_1$). Multiple elements herein may be identified by part numbers that share a base number in common and that differ by their suffixes (e.g., $112_1$, $112_2$, and $112_3$). All elements with a common base number may be referred to collectively or generically using the base number without a suffix (e.g., 112).

As used herein and in the claims, "up", "down", "above", "below", "upwardly", "vertical", "elevation" and similar terms are in reference to a directionality generally aligned with (e.g., parallel to) gravity. However, none of the terms referred to in this paragraph imply any particular alignment between elements. For example, a first element may be said to be "vertically above" a second element, where the first element is at a higher elevation than the second element, and irrespective of whether the first element is vertically aligned with the second element.

Figure 2:
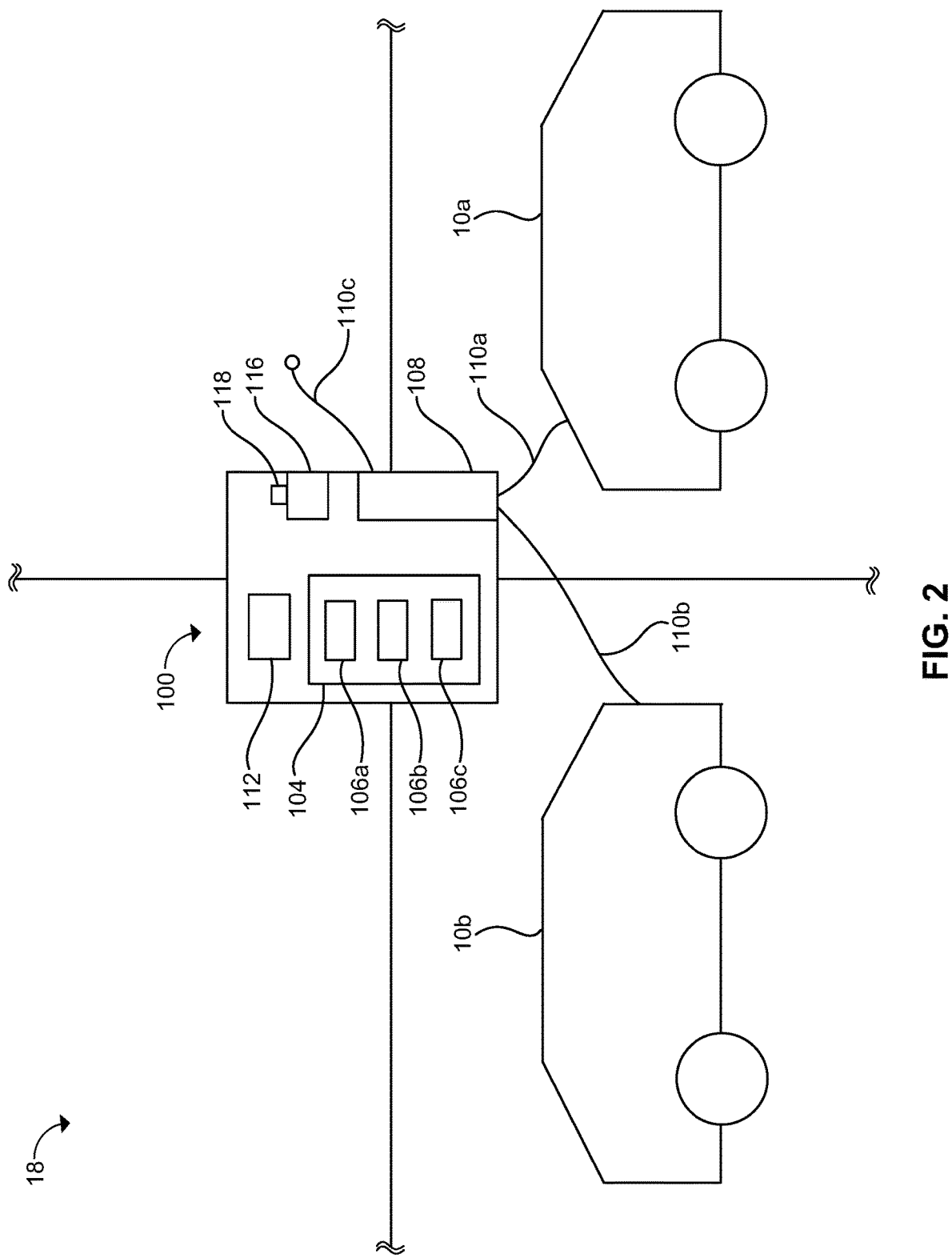
FIG. 2 is a schematic illustration of another example hybrid apparatus that includes a cryptocurrency miner and an EV charger, in accordance with an embodiment.

Described herein are hybrid apparatuses and methods of operating the hybrid apparatuses. Reference is first made to FIGS. 1 and 2. FIG. 1 shows a schematic illustration of an example hybrid apparatus 100 for mining cryptocurrency and charging EVs located at a building 14. Building 14 can include any building, structure or facility used for residential, commercial, industrial, or other purposes. Building 14 can include, for example, a house, a car dealership, a garage, a gas station, a restaurant, a hotel, a store, a warehouse, etc. In the illustrated example, hybrid apparatus 100 is located inside building 14. In other examples, hybrid apparatus 100 may be located outside building 14. FIG. 2 shows a schematic illustration of an example hybrid apparatus 100 for mining cryptocurrency and charging EVs located at an exterior environment 18. Exterior environment 18 can include, for example, a parking lot, a parking garage, or a driveway.

In the illustrated examples, hybrid apparatus 100 includes a cryptocurrency miner 104, an EV charger 108, a power coordinator 112, and an electric power input 116. EV charger 108 may have one or more vehicle power outlets 110.

A conventional EV charging infrastructure may only generate revenue when the EV charging infrastructure is supplying charging power to an EV, and the charging infrastructure may remain idle and not generate revenue at other times. For example, a typical EV charging infrastructure may be idle for 50-90% of each 24-hour period, including eight or more idle hours each night. In contrast, hybrid apparatus 100 may provide continuous revenue generation by—(1) simultaneously mining cryptocurrency and supplying charging power to EVs (e.g., EV 10a connected to vehicle power outlet 110a) and (2) continuing to mine cryptocurrency when no charging power is being supplied to EVs. This may greatly increase revenue generation and profitability. In turn, this technology has the potential to accelerate the expansion of electric vehicle charging networks, which may be necessary to achieve wide adoption of electric vehicles in pursuit of government climate change goals.

Electric power input 116 receives electric power (e.g., from mains power delivered by an electric utility company or a power generator) and that electric power is supplied to EV charger 108 and cryptocurrency miner 104. Electric power input 116 may be associated with a rated maximum power capacity. For example, the rated maximum power capacity may be based on the rating of the components of electric power input 116 itself or of an upstream or downstream component (e.g., cable or circuit breaker), or based on a maximum power value prescribed by an electric utility company or power generator. Hybrid apparatus 100 may prioritize power demand by EV charger 108 (supplying power to EVs 10) and provide a remainder of the available power (within the rated maximum power capacity) to cryptocurrency miner 104.

Cryptocurrency miner 104 may have multiple cryptocurrency mining computers 106 (e.g., cryptocurrency mining computers 106a-106c shown in FIGS. 1 and 2) with each mining computer 106 having an adjustable intensity level. Mining computers 106 can have any design suitable for performing cryptocurrency mining operations. Each mining computer may include one or more cryptocurrency mining boards, as described in further detail herein with reference to FIG. 9. In some embodiments, mining computers 106 may belong to the Whatsminer® series of mining computers. For example, the mining computers may belong to the M20, M30 or M50 series of Whatsminer® mining computers. In other embodiments, mining computers 106 may not belong to the Whatsminer® series of mining computers. For example, the mining computers may belong to the Bitmain Antminer® S19 series of mining computers including S19 (90TH), S19 Pro (100TH), S19J Pro+(120TH), and S19 XP (141TH), or any other series of mining computers or any generic computers suitable for performing cryptocurrency mining operations.

In some embodiments, cryptocurrency miner 104 can be replaced by a server for performing any specialized or general-purpose computing tasks. For example, the server 104 can be configured as an artificial intelligence (AI) server for performing AI processing tasks. Server 104 may receive the AI processing tasks from an external device, e.g., a centralized server or a repository. The external device may include multiple AI processing tasks (e.g., a stored queue of AI processing tasks). The server 104 may sequentially retrieve an AI processing task, process the retrieved task and provide results based on the processed task to the external device. The external device may provide revenue to server 104 in exchange for performing the AI processing tasks. Server computers 106 of server 104 can have any design suitable for performing specialized or general-purpose computing tasks. For the above example where server 104 is configured as an AI server, server computer 106 can have any design suitable for performing the AI processing tasks. In some embodiments, server computers 106 can be NVIDIA® V100 Tensor Core GPUs. In other embodiments, server computers 106 can be any other series of processors specialized for performing AI processing tasks or any generic processors suitable for performing AI processing tasks.

As described in further detail herein below, power coordinator 112 may adjust the intensity levels of each mining computer 106 based on the available power for cryptocurrency mining so that mining computers 106 can continue to mine cryptocurrency while power is delivered to an electric vehicle without exceeding the rated maximum power capacity of electric power input 116. For example, if EV charger 108 requires only 60% of the rated maximum power capacity for EV charging, then the remaining 40% of the rated maximum power capacity can be supplied to cryptocurrency miner 104. This may represent a significant improvement in cryptocurrency mining efficiency as compared to disabling cryptocurrency miner 104 whenever EV charger 108 is operating.

Figure 3:
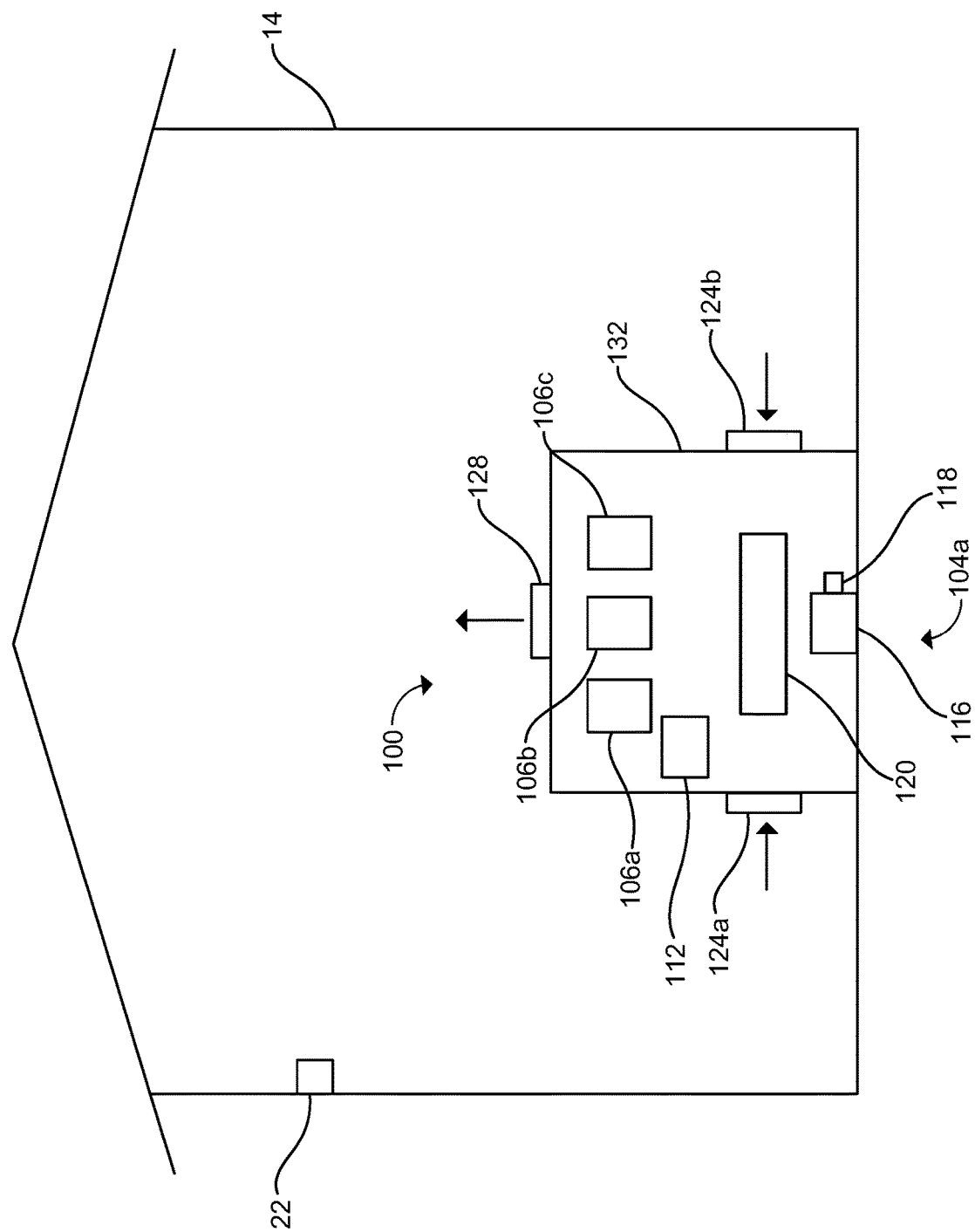
FIG. 3 is a schematic illustration of an example hybrid apparatus that includes a cryptocurrency mining furnace, in accordance with an embodiment.

Referring now to FIG. 3, shown therein is a schematic illustration of an example hybrid apparatus 100 located at a building 14. In the illustrated example, hybrid apparatus 100 is located inside building 14. In other examples, hybrid apparatus 100 may be located outside building 14. Hybrid apparatus 100 may include a cryptocurrency miner 104a, a power coordinator 112, and an electric power input 116. In the illustrated example, cryptocurrency miner 104a is a cryptocurrency mining furnace. Hybrid apparatus 100 may simultaneously perform cryptocurrency mining and provide heating for building 14.

In the illustrated example, hybrid apparatus 100 can provide functionalities including functionalities provided by a space heater. For example, hybrid apparatus 100 may not include any air inlet or exhaust to the exterior of building 14. Hybrid apparatus 100 may induce air flow from interior of building 14 through mining computers of cryptocurrency miner 104a. The heat generated during cryptocurrency mining can warm the induced air and the resulting warmer air may be induced out of hybrid apparatus to provide heating functionality to interior of building 14. Cryptocurrency miner 104a may include fewer components compared with cryptocurrency miner 104b shown in FIG. 4. For example, cryptocurrency miner 104a may not include a built-in transformer and this can enable hybrid apparatus 100 to provide space heater functionalities with a compact design and small footprint.

Cryptocurrency miner 104a may include multiple cryptocurrency mining computers 106 (e.g., cryptocurrency mining computers 106a-106c), a principal fan 120, air inlet ducts 124, a building heat outlet duct 128, and a furnace housing 132. In the illustrated example, power coordinator 112 and electric power input 116 are located within furnace housing 132. In other examples, power coordinator 112 and electric power input 116 may be located outside furnace housing 132.

Cryptocurrency miner 104a may consume significant amounts of electrical energy and generate large amounts of heat energy during cryptocurrency mining. A conventional cryptocurrency miner may use a cooling system (that can itself consume additional energy) to dissipate the generated heat energy as waste heat.

In contrast, cryptocurrency miner 104a can enable harnessing heat energy generated by cryptocurrency mining for useful building heating purposes instead of being dissipated as waste heat. For a typical cryptocurrency miner, 95-100% of electrical energy consumed by the miner may be converted to heat energy. Accordingly, cryptocurrency miner 104a may provide heating for building 14 with high energy conversion efficiency. Additionally, based on a valuation of the cryptocurrency and a cost of electric power, the revenue generated from cryptocurrency mining by hybrid apparatus 100 may completely cover the cost of the electric power consumed by hybrid apparatus 100 thereby providing heating to building 14 at no additional cost.

Building heat outlet duct 128 of cryptocurrency miner 104a may be fluidly coupled to building 14. Further, building heat outlet duct 128 may be thermally coupled to heat generated by mining computers 106. Cryptocurrency miner 104a may use principal fan 120 to induce an air flow from air inlet ducts 124, through mining computers 106. The temperature of the induced air flow may increase as it removes heat energy generated during cryptocurrency mining by mining computers 106. The resulting warmer air may be induced out of building heat outlet duct 128 to provide heating for building 14.

Power coordinator 112 may receive a target furnace heating level from a temperature controller 22 of building 14. Temperature controller 22 may be, for example, a thermostat that receives a temperature setpoint for building 14 and generates the target furnace heating level accordingly. Each mining computer 106 may have an adjustable intensity level. As described in further detail herein below, power coordinator 112 may adjust the intensity levels of each mining computer 106 such that heating provided to building 14 is no higher than the target furnace heating level. The actual heat output of cryptocurrency miner 104a may not change instantaneously when the intensity levels of mining computers 106 are changed based on the target furnace heating level. For example, thermal inertia may cause a time delay between when adjustments to intensity levels of mining computers and when a change in temperature of the induced air flow that transports heat energy to building 14. During this time delay, the actual heat output of cryptocurrency miner 104 may exceed the target heat output.

Figure 4:
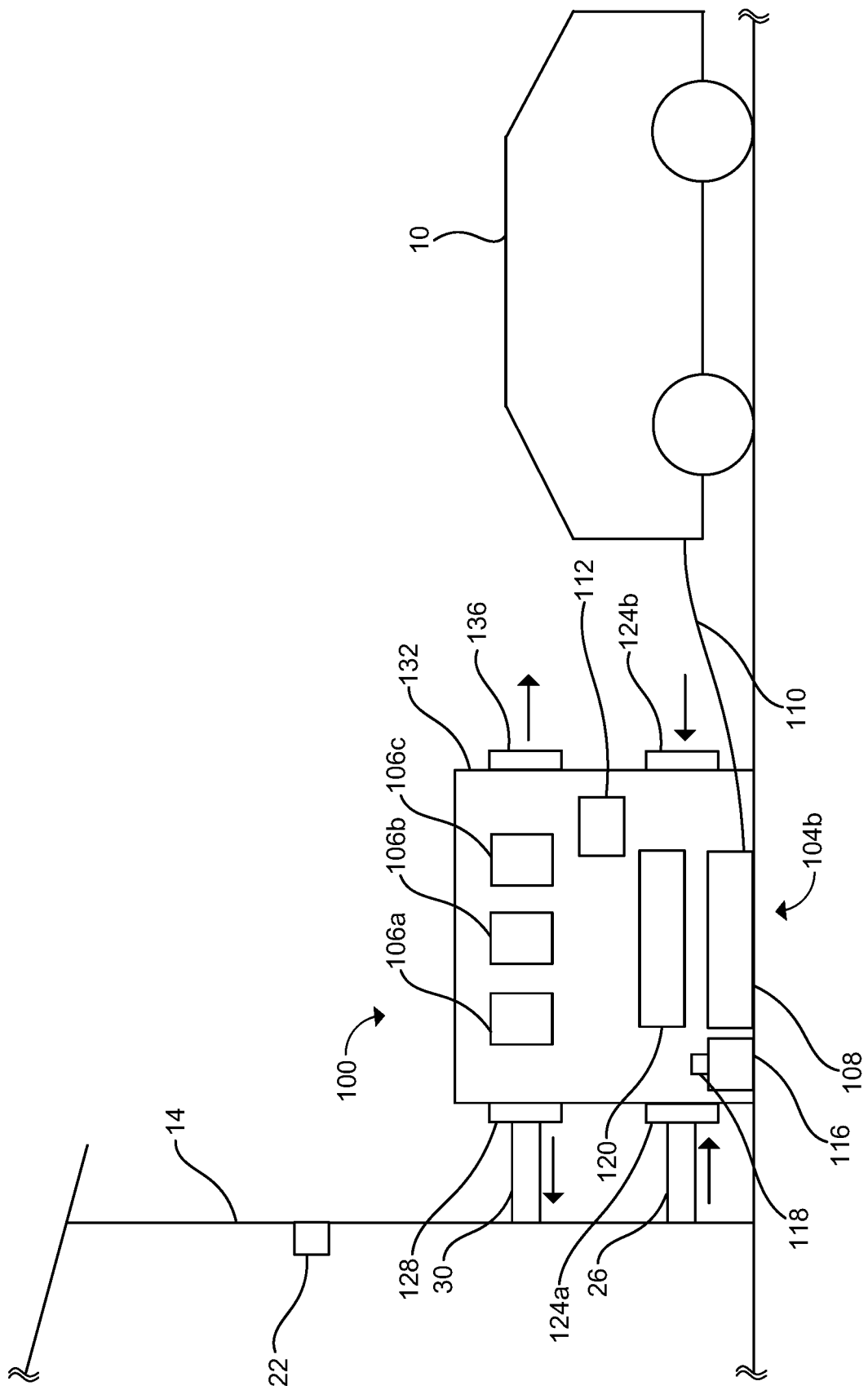
FIG. 4 is a schematic illustration of an example hybrid apparatus that includes a cryptocurrency mining furnace and an EV charger, in accordance with an embodiment.

Referring now to FIG. 4, shown therein is a schematic illustration of an example hybrid apparatus 100 located at a building 14. In the illustrated example, hybrid apparatus 100 is located outside building 14. In other examples, hybrid apparatus 100 may be located inside building 14. Building 14 can include any building, structure or facility used for residential, commercial, industrial, warehouse or other purposes. Building 14 can include, for example, a house, a car dealership, a garage, a gas station, a restaurant, a hotel, a store, a greenhouse, etc.

Hybrid apparatus 100 may include a cryptocurrency miner 104b, an EV charger 108, a power coordinator 112, and an electric power input 116. In the illustrated example, cryptocurrency miner 104b is a cryptocurrency mining furnace. Hybrid apparatus 100 may simultaneously perform cryptocurrency mining, EV charging and provide heating for building 14. EV charger 108 may have one or more vehicle power outlets 110 configured to supply charging power to EVs (e.g., EV10).

Cryptocurrency miner 104b may include multiple cryptocurrency mining computers 106 (e.g., cryptocurrency mining computers 106a-106c), a principal fan 120, air inlet ducts 124, a building heat outlet duct 128, a heat exhaust duct 136 and a furnace housing 132. In the illustrated example, power coordinator 112 and electric power input 116 are located within furnace housing 132. In other examples, power coordinator 112 and electric power input 116 may be located outside furnace housing 132.

One or more air inlet ducts (e.g., air inlet duct 124a) may be fluidly coupled to building 14 (e.g., via duct 26). Alternatively or in addition, one or more air inlet ducts (e.g., air inlet duct 124b) may be fluidly coupled to an exterior environment of building 14. Building heat outlet duct 128 may be fluidly coupled to building 14 (e.g., via duct 30). Heat exhaust duct 136 may be fluidly coupled to an exterior environment of building 14.

Building heat outlet duct 128 and heat exhaust duct 136 may be thermally coupled to heat generated by mining computers 106. Cryptocurrency miner 104b may use principal fan 120 to induce an air flow from air inlet ducts 124 and through mining computers 106. The temperature of the induced air flow may increase as it removes heat energy generated by mining computers 106 during cryptocurrency mining. The resulting warmer air may be used for heating building 14 (by inducing air flow from building heat outlet duct 128 to building 14) or may be exhausted to the environment (by inducing air flow from heat exhaust duct 136 to the exterior environment of building 14) or both.

A disadvantage associated with conventional EV charging infrastructure may be the additional power load added to the electric utility system each time an EV is connected to the EV charging infrastructure for charging. For example, a building 14 may have a 300 kVA electric utility service to meet the power requirements of building 14. For adding a three-car EV charging infrastructure (e.g., one 100 kW changer and two 50 kW chargers for a total charging capacity of 200 kW), a new utility transformer with a capacity of 225 kVA would be required to be installed at building 14 for a new total power capacity of 525 kVA. Furthermore, the addition of new EV charging infrastructure may increase peak power demand that can cause overloading of utility transformers. The additional peak power demand can especially be a problem during cold winter weather when peak power demand may be high due to electric heating loads and the electric utility power networks may be loaded at or near maximum power capacity. Therefore, electric utility companies may need to consider the impact of the new EV charging infrastructure and make upgrades to their regional power distribution infrastructure.

In contrast, hybrid apparatus 100 may enable the addition of EV charging capacity without requiring additional utility transformers and/or regional power distribution infrastructure. When no EV charging is being performed, hybrid apparatus 100 can perform cryptocurrency mining and use heat generated by cryptocurrency mining to provide heating for building 14 while limiting power draw of cryptocurrency miner 104b to a rated maximum power capacity. When an EV is connected to hybrid apparatus 100 for charging (e.g., using vehicle power outlet 110), power coordinator 112 may be configured to prioritize power demand by EV charger 108. Power coordinator 112 may reduce the power draw of cryptocurrency miner 104b to limit the total power draw of hybrid apparatus 100 (i.e., the sum of the power draw of EV charger 108 and cryptocurrency miner 104b) to the rated maximum power capacity. This may cause a temporary reduction (while EV 10 is charging) in levels of cryptocurrency mining and heating provided to building 14. Hybrid apparatus 100 can restore the cryptocurrency mining and heating operation after the EV charging is completed. Power coordinator 112 may also receive a target furnace heating level from temperature controller 22 and may control operation of cryptocurrency miner 104b such that heating provided to building 14 is no higher than the target furnace heating level (in addition to limiting the total power draw as described above).

As described above, hybrid apparatus 100 can provide EV charging without increasing the peak power demand. This can avoid the cost and complexity associated with additional utility transformers and/or regional power distribution infrastructure required by conventional EV charging infrastructure. Furthermore, electric utility companies may often use renewable energy sources to meet typical power demand and use non-renewable/higher-polluting energy sources (e.g., oil, diesel, coal, etc.) to meet additional peak power demands. Therefore, hybrid apparatus 100 may provide environmental benefits by limiting the peak power demand while providing EV charging capacity.

Figure 5:
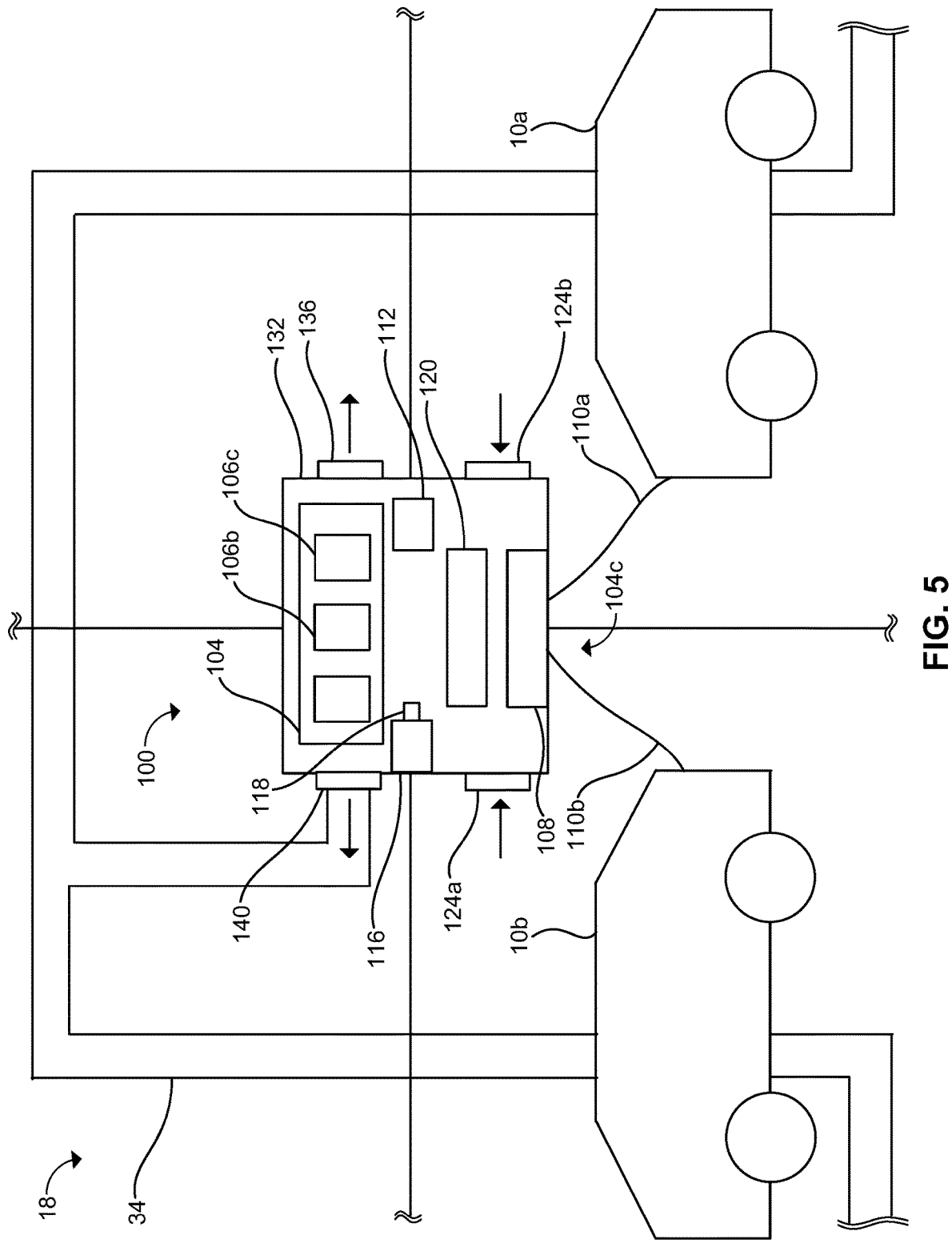
FIG. 5 is a schematic illustration of another example hybrid apparatus that includes a cryptocurrency mining furnace and an EV charger, in accordance with an embodiment.

Referring now to FIG. 5, shown therein is a schematic illustration of an example hybrid apparatus 100 located at an exterior environment 18. Exterior environment 18 can include, for example, a parking lot, a parking garage, or a driveway.

Hybrid apparatus 100 may include a cryptocurrency miner 104c, an EV charger 108, a power coordinator 112, and an electric power input 116. In the illustrated example, cryptocurrency miner 104c is a cryptocurrency mining furnace. Hybrid apparatus 100 may simultaneously perform cryptocurrency mining, EV charging and provide heating for exterior environment 18. EV charger 108 may have one or more vehicle power outlets 110 configured to supply charging power to EVs (e.g., EV 10a and EV 10b).

The batteries of EV vehicle may require more frequent charging during cold weather thereby increasing the importance of access to EV charging. Cold weather in many area may be associated with snowfall and/or icy surfaces that may impede access to or egress from an EV charger. The heating provided by hybrid apparatus 100 may be used for melting ice and/or snow from road surfaces, driveways and/or parking spaces in exterior environment 18 and improve access to or egress from EV charger 108. This may also avoid the costs and/or complexity associated with snow and/or ice removal operations around EV charger 108, particularly in remote areas. The feasibility of using an EV depends on the availability of EV chargers along the routes users travel. By mitigating issues of snow and ice obstruction, hybrid apparatus 100 may greatly improve the feasibility of owning an EV, particularly in remote areas.

Cryptocurrency miner 104c may include multiple cryptocurrency mining computers 106 (e.g., cryptocurrency mining computers 106a-106c), a principal fan 120, air inlet ducts 124, a heat exhaust duct 136, a driveway heat outlet duct 140, and a furnace housing 132. In the illustrated example, power coordinator 112 and electric power input 116 are located within furnace housing 132. In other examples, power coordinator 112 and electric power input 116 may be located outside furnace housing 132.

Heat exhaust duct 136 may be fluidly coupled to an exterior environment of building 14. Driveway heat outlet duct 140 may be fluidly coupled to driveway heating duct 34. Driveway heating duct 34 may include one or more interconnected subterranean ducts (e.g. installed under a concrete or asphalt surface of exterior environment 18).

Heat exhaust duct 136 and driveway heat outlet duct 140 may be thermally coupled to heat generated by mining computers 106. Cryptocurrency miner 104c may use principal fan 120 to induce an air flow through mining computers 106. The air flow may be induced from air inlet ducts 124. Optionally, cryptocurrency miner 104c may not include air inlet ducts 124 and principal fan 120 may induce a recirculating air flow through mining computers 106, driveway heat outlet duct 140 and driveway heating duct 34.

The temperature of the induced air flow may increase as it removes heat energy generated by mining computers 106 during cryptocurrency mining. The resulting warmer air may flow through driveway heating duct 24 and provide heating for surfaces of exterior environment 18.

Figure 6:
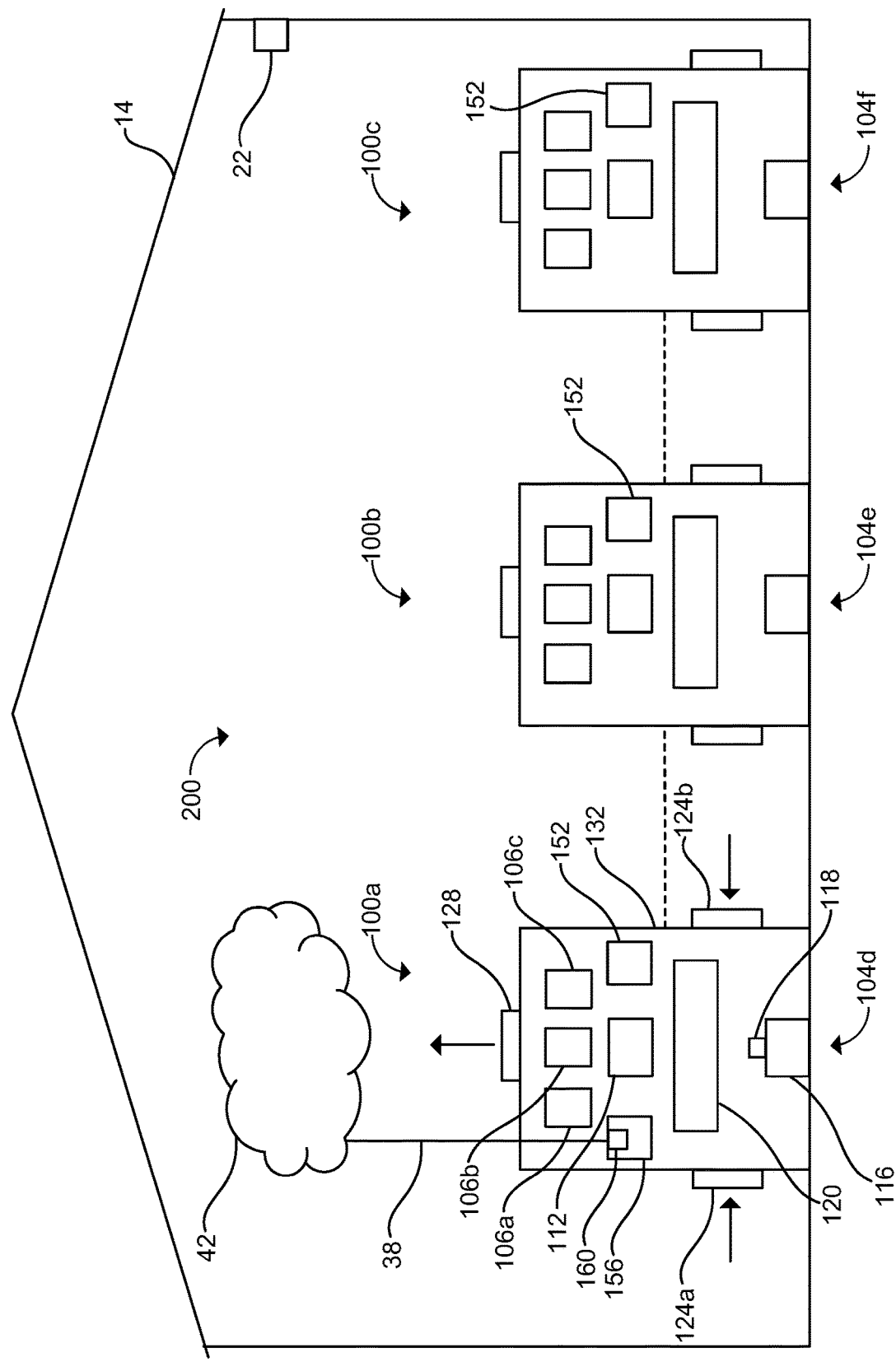
FIG. 6 is a schematic illustration of multiple hybrid apparatuses communicatively coupled to form a mesh network system, in accordance with an embodiment.

Referring now to FIG. 6, shown therein is a schematic illustration of multiple hybrid apparatuses 100a-100c communicatively coupled to form a mesh network system 200 located at a building 14. In the illustrated example, each of the hybrid apparatuses 100a-100c includes a cryptocurrency miner 104 that is a cryptocurrency mining furnace (104d-104f). In other examples, one or more of cryptocurrency miners 104 may not be a cryptocurrency mining furnace (i.e., may not be configured to output hot air into building ducting). Optionally, one or more of hybrid apparatuses 100a-100c may include an EV charger 108.

Each cryptocurrency mining furnace 104d-104f may have multiple cryptocurrency mining computers (106a-106c), a principal fan 120, air inlet ducts 124, a building heat outlet duct 128, a furnace housing 132, and a wireless radio 152. In alternative embodiments, any of cryptocurrency miners 104 that are not furnaces may not have ducts 124, 128.

In the illustrated example, power coordinator 112 and electric power input 116 of each hybrid apparatus 100 are located within furnace housing 132. In other examples, power coordinator 112 and electric power input 116 may be located outside furnace housing 132.

Building heat outlet duct 128 of each cryptocurrency miner 104 may be fluidly coupled to building 14. Further, building heat outlet duct 128 may be thermally coupled to heat generated by mining computers 106.

In the illustrated example, mesh network system 200 includes three cryptocurrency miners 104d-104f. In other examples, mesh network system 200 may include a greater number of cryptocurrency miners (e.g., 4 to 100). For example, building 14 may be a three-storey building and four cryptocurrency miners may be positioned on each level of building 14. Larger number of cryptocurrency miners may provide larger cryptocurrency mining capacity and/or greater distribution of furnaces to improve heating uniformity for building 14. In some examples (very large stores, warehouses etc.), mesh network system 200 may include greater than 100 cryptocurrency miners (e.g., 100 to 200 cryptocurrency miners).

Cryptocurrency miner 104d may also include a network interface card 156 having a network wire connector 160 supporting wired connectivity (e.g., wired ethernet connection 38) to an internet source (e.g., cloud-based network 42). Cryptocurrency miner 104d may directly exchange cryptocurrency mining data with cloud-based network 42 by way of network interface card 156. Cryptocurrency mining data may include, for example, blockchain data, hashing functions and/or hash values.

Wireless radios 152 of cryptocurrency miners 104d-104f may have any suitable design to support wireless connectivity (e.g., a Wi-Fi connection) between cryptocurrency miners 104. For example, cryptocurrency miner 104e may exchange cryptocurrency mining data with network interface card 156 by way of wireless radios 152 of cryptocurrency miners 104d and 104e. This may enable cryptocurrency miner 104e to exchange cryptocurrency mining data with cloud-based network 42 without having its own wired network interface card and a dedicated wired connection.

Cryptocurrency miner 104f may be out of range to communicate with cryptocurrency miner 104d by way of wireless radios 152 of cryptocurrency miners 104d and 104f. However, cryptocurrency miner 104f may exchange cryptocurrency mining data with network interface card 156 by way of wireless radios of cryptocurrency miners 104d, 104e, and 104f. This may enable cryptocurrency miner 104f to exchange cryptocurrency mining data with cloud-based network 42 without having its own wired network interface card and a dedicated wired connection.

In the above-described manner, cryptocurrency miners 104d, 104e and 104f may form a meshed network system 200. Meshed network system 200 may reduce cost and complexity of providing a wired connection to each cryptocurrency miner thereby enabling a distributed network of cryptocurrency miners in available space of building 14.

Reference is now made to FIGS. 1 to 6. Electric power input 116 may have any suitable design for receiving electrical energy and distributing the received electrical energy to other elements of hybrid apparatus 100. Electric power input 116 may receive electrical energy from a utility power grid. Optionally, electric power input 116 may receive electrical energy from a renewable energy source that includes a solar cell, a wind turbine and/or an energy storage device.

In some embodiments, electric power input 116 may include a wired electrical connection configured to receive 3-phase electrical power (e.g., 3-phase power at 50 Hz or 60 Hz in a voltage range from 200V to 500V). For example, electric power input 116 may be configured to receive 3-phase 50 Hz or 60 Hz electrical power at 208V, 230V, 380V, 416V or 480V. In other embodiments, electric power input 116 may include a wired electrical connection configured to receive single-phase electrical power (e.g., single-phase power at 50 Hz or 60 Hz in a voltage range from 200V to 300V). For example, electric power input 116 may be configured to receive single-phase 50 Hz or 60 Hz electrical power at 208V, 230V, 240V or 277V. Electric power input 116 may enable flexible operation and world-wide compatibility of hybrid apparatus 100 with a wide range of electrical power infrastructure.

The input voltage flexibility of electric power input 116 may enable reduction in cost and complexity by providing compatibility with pre-existing transformers and/or distribution panels and avoiding the requirement for new transformers and/or distribution panels. In some cases, new transformers and/or distribution panels may be installed for hybrid apparatus 100. For example, multiple hybrid apparatuses may be located at a single location (e.g., multiple hybrid apparatuses located throughout or around a large building) and new transformers and/or distribution panels may be installed throughout the location in proximity to the multiple hybrid apparatuses to provide a reduction in the length of power input cables to hybrid apparatuses 100. This may reduce installation costs.

In some embodiments, electric power input 116 may be directly connected to other elements of hybrid apparatus 100 (e.g., cryptocurrency miner 104, EV charger 108, power coordinator 112). In other embodiments, electric power input 116 may be connected to a transformer and/or power supply that receives electrical energy from electric power input 116 and provides the received electrical energy to other elements of hybrid apparatus 100 (e.g., cryptocurrency miner 104, EV charger 108, power coordinator 112). The transformer and/or power supply may provide functionality such as stepping down input voltage, smoothing input voltage fluctuations etc.

Electric power input 116 may be associated with a rated maximum power capacity. In some embodiments, the rated maximum power capacity may be based on a rating of the electrical components of electric power input 116 itself. In other embodiments, the rated maximum power capacity may be based on a rated capacity of an upstream or downstream component (e.g., upstream transformer, distribution panel, cable, fuse box etc. or downstream transformer, cable, battery etc.).

In some embodiments, hybrid apparatus 100 may also include one or more power meters 118. In the illustrated examples, power meter 118 is positioned at electric power input 116. In other examples, power meter 118 may be positioned at other locations. Power meters 118 may have any suitable design to measure power drawn by one or more components of hybrid apparatus 100. For example, power meters 118 may measure power drawn by electric power input 116, cryptocurrency miner 104 and/or EV charger 108. Power meters 118 may provide output signals indicating measured power values to other components of hybrid apparatus 100, for example, power coordinator 112. The output signals may be analog signals or digital signals.

Reference is now made to FIGS. 1, 2, 4 and 5. EV charger 108 may be electrically connected to electric power input 116 to receive electrical energy. EV charger 108 may have any suitable number of vehicle power outlets 110 to provide electrical energy to EVs connected to EV charger 108. For example, EV charger 108 may have one to ten vehicle power outlets 110. A smaller number of vehicle power outlets 110 may have a smaller initial capital expenditure cost and installation complexity. A larger number of vehicle power outlets 110 may provide higher cost efficiency by reducing the capital expenditure cost per vehicle power outlet. A larger number of vehicle power outlets 110 may also provide greater flexibility by providing vehicle power outlets that are compatible with a wider variety of EVs. In some embodiments, EV charger 108 may have four to six power outlets 110 to provide a balance between initial capital expenditure, cost efficiency and charging flexibility.

Vehicle power outlets 110 may have any suitable design to enable connection of an EV (e.g., EV 10) to EV charger 108 and provide charging power to the EV. For example, vehicle power outlets 110 may include Level 3 chargers having 480V charging circuits that deliver a maximum charging power of 50 kW to 350 kW. Level 3 chargers may require higher initial capital expenditure cost (compared with Level 2 chargers) but may provide faster charging times for EVs and a lower capital expenditure cost per kWhr. As another example, vehicle power outlets 110 may include Level 2 chargers having 240V charging circuits that deliver a maximum charging power of 3.7 to 17.2 kW. Level 2 chargers may provide slower charging time and a higher capital expenditure cost per kWhr (compared with Level 3 chargers) but may require lower initial capital expenditure cost.

EV charger 108 may include multiple vehicle power outlets 110 of the same or different types. For example, EV charger 108 may include three vehicle power outlets 110 that are identical 50 kW (maximum charging power) Level 3 chargers. EV charger 108 having identical vehicle power outlets 110 may require lower installation complexity. As another example, EV charger 108 may include four vehicle power outlets 110 that include one 100 kW (maximum charging power) Level 3 charger, two 50 kW (maximum charging power) Level 3 chargers and one 15 kW (maximum charging power) Level 2 charger. EV charger 108 having different types of vehicle power outlets 110 may provide greater flexibility regarding cost/charging time and/or greater compatibility with different types of EVs.

EV charger 108 may have a maximum charger power draw from electric power input 116. The maximum charger power draw may be associated with delivering a maximum charger output to vehicle power outlets 110. The maximum charger power draw may be less than the rated maximum power capacity associated with electric power input 116.

In some embodiments, the maximum charger power draw may be based on a sum of the maximum power deliverable by vehicle power outlets 110. For example, EV charger 108 may have one 150 kW and two 50 kW vehicle power outlets 110 and the maximum charger power draw may be equal to 250 kW. In other embodiments, the maximum charger power draw may be limited by the maximum capacity of electrical circuitry of EV charger 108 to deliver power to vehicle power outlets 110. For an example EV charger 108 having one 150 kW and two 50 kW vehicle power outlets 110, the maximum charger power draw may be equal to 200 kW, i.e., less than a sum of the maximum power deliverable by vehicle power outlets 110. In this example, EV charger 108 may not be able to deliver maximum charging power if three EVs are simultaneously connected to the one 150 kW and two 50 kW vehicle power outlets. EV charger 108 (of the present example) may deliver a maximum charging power of 200 kW to two simultaneously connected EVs (e.g., both EVs connected to the 50 kW vehicle power outlets, or one EV connected to the 150 kW vehicle power outlet and another EV connected to the 50 kW vehicle power outlet).

Reference is now made to FIGS. 1 to 6. Cryptocurrency miner 104 may be electrically connected to electric power input 116 to receive electrical energy. In some embodiments, cryptocurrency miner 104 may be a cryptocurrency mining furnace (e.g., as illustrated in FIGS. 3 to 6). The cryptocurrency mining furnace can be, for example, a cryptocurrency mining furnace as described in U.S. Pat. No. 11,638,364, the entire contents of which are hereby incorporated by reference.

Figure 7:
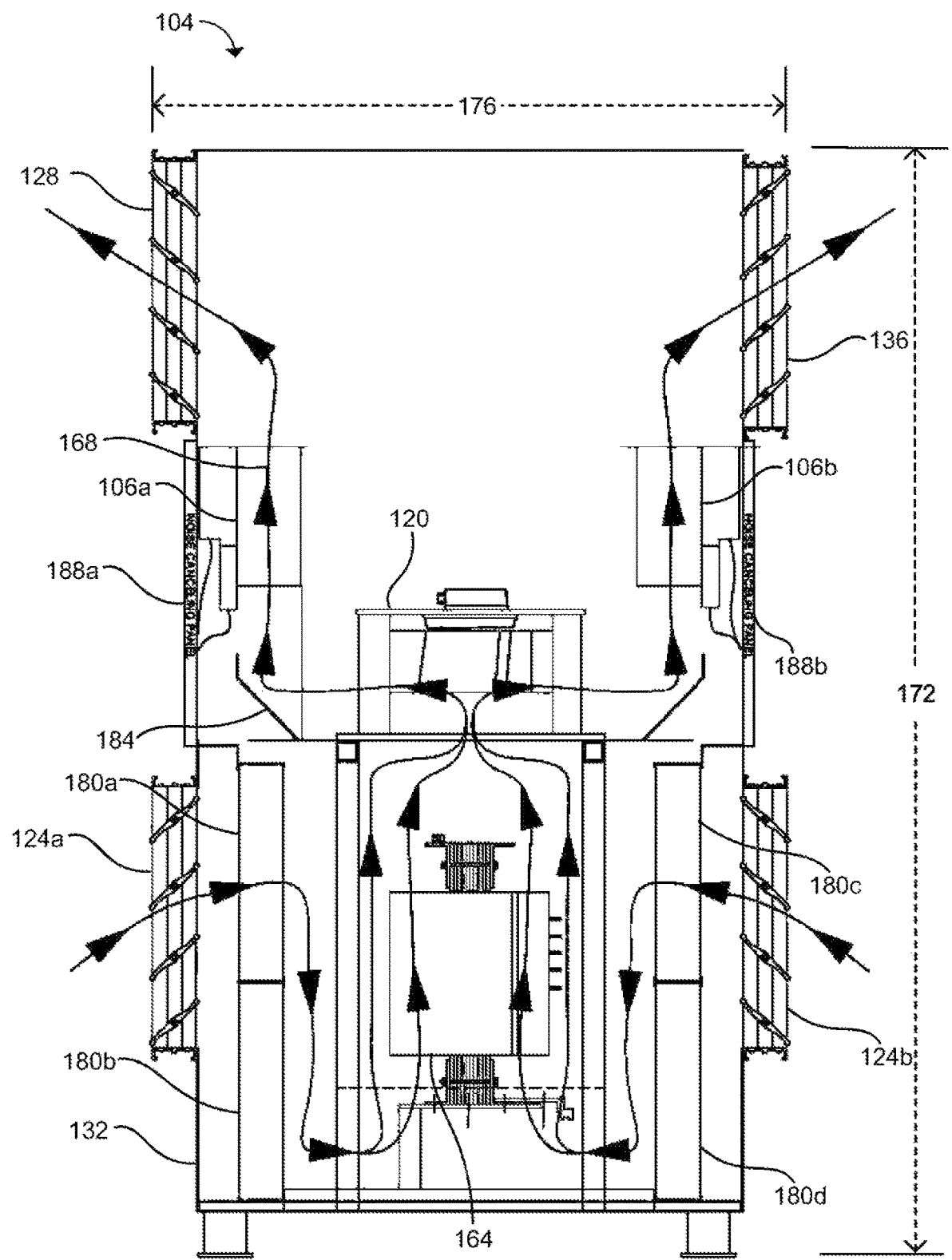
FIG. 7 is a schematic cross-sectional view of a cryptocurrency mining furnace in accordance with an embodiment.

Referring now to FIG. 7, shown therein is a schematic cross-sectional view of a cryptocurrency miner 104 that is a cryptocurrency mining furnace (e.g., cryptocurrency miner 104b shown in FIG. 4). In the illustrated example, cryptocurrency miner 104 includes mining computers 106, a principal fan 120, air inlet ducts 124a and 124b, a building heat outlet duct 128, a furnace housing 132, a heat exhaust duct 136, and a transformer 164.

Furnace housing 132 may define an air flow path 168 extending downstream from air inlet ducts 124 to building heat outlet duct 128 and heat exhaust duct 136. As shown in FIG. 7, air flow path 168 may pass through transformer 164, principal fan 120 and mining computers 106 positioned in furnace housing 132. In some embodiments, air flow path 168 may not pass through transformer 164 and/or mining computers 106 to protect the transformer and/or mining computers from dust and/or contaminants present in the induced air flow. Instead, cryptocurrency miner 104 may include a heat exchanger for exchanging heat between the induced air flow and the transformer 164 and/or mining computers 106.

Furnace housing 132 may have any design that provides an enclosure suitable for housing the elements of cryptocurrency miner 104. In the illustrated example, transformer 164, principal fan 120, and mining computers 106 are positioned within the enclosure of furnace housing 132. Placing all of these components within a unitary housing 132 may provide cryptocurrency miner 104 with a compact design and smaller footprint, all things being equal. In some embodiments, one or more of EV charger 108, power coordinator 112 and electric power input 116 of hybrid apparatus 100 may be positioned within the enclosure of furnace housing 132. In alternative embodiments, one or more components of cryptocurrency miner 104 and/or hybrid apparatus 100 may be located external to furnace housing 132.

Furnace housing 132 can be of any size suitable to house other elements of cryptocurrency miner 104 and/or hybrid apparatus 100. In some embodiments, furnace housing 132 may have a furnace height 172 of 2700 mm or less (e.g., 1500 mm-2700 mm), and a furnace width 176 of 1800 mm or less (e.g., 1000 mm-1800 mm). A furnace of this size may provide sufficient interior space to support the other components, while limiting the footprint of hybrid apparatus 100. In other embodiments, the furnace height 172 may be larger than 2700 mm (e.g., 2700 mm-4000 mm) and/or furnace width 176 may be larger than 1800 mm (e.g., 1800 mm-2500 mm). This may allow furnace housing 132 to have capacity to support a larger transformer 164 and/or greater number of mining computers 106.

In the illustrated example, cryptocurrency miner 104 includes two air inlet ducts 124a and 124b. In other embodiments, cryptocurrency miner 104 may include greater than two (e.g., 2-8) air inlet ducts. This may allow larger amounts of air to be induced into air flow path 168.

Air inlet duct 124b may be fluidly coupled to the exterior environment around cryptocurrency miner 104 to induce air from the exterior environment into air flow path 168. This may permit exterior cool air to be induced into air flow path 168 to provide cooling for the components within furnace housing 132. In other embodiments, air inlet duct 124b may not be coupled to the exterior environment.

In some embodiments, air inlet duct 124a may be fluidly coupled to building 14 (e.g., using duct 26 shown in FIG. 4) to induce air from interior of building 14 into air flow path 168. This may permit interior warm air to be mixed with exterior air induced through an exterior-coupled inlet (e.g., air inlet duct 124b) to provide temperature control of air induced into furnace housing 132. In other embodiments, air inlet duct 124a may not be fluidly coupled to interior environment of building 14.

Air inlet ducts 124 can have any design suitable for admitting air into air flow path 168. For example, air inlet ducts 124 may include one or more of ducts, louvers, hood or awning assemblies. In some embodiments, air inlet ducts 124 may be provided with an inlet damper assembly for controlling the amount of air induced into air flow path 168. In other embodiments, air inlet ducts 124 may not be provided with an inlet damper assembly.

In some embodiments, cryptocurrency miner 104 may include air filters 180 positioned in furnace housing 132 in air flow path 168 upstream of transformer 164. Air induced through air inlet ducts 124 into furnace housing 132 may include dust particles that can attach to and clog up various components of cryptocurrency miner 104. Air filters 180 can filter out at least a portion of the dust particles from air induced through air inlet ducts 124 and protect various components of cryptocurrency miner 104.

In the illustrated example, cryptocurrency miner 104 includes a building heat outlet duct 128. In other embodiments, cryptocurrency miner 104 may include a greater number (e.g., 2 to 8) of building heat outlet ducts. This may allow larger amounts of air to be induced out of furnace housing 132 to building 14.

Building heat outlet duct 128 can be fluidly coupled to building 14 (e.g., using duct 30 shown in FIG. 4) to induce air flow from furnace housing 132 to interior of building 14. This may permit warm air from cryptocurrency miner 104 to be induced into an interior environment of building 14 to provide heating for building 14.

Building heat outlet duct 128 can have any design suitable for inducing air out of air flow path 168. For example, building heat outlet duct 128 may include one or more of ducts, louvers, hood or awning assemblies. In some embodiments, building heat outlet duct 128 may be provided with an outlet damper assembly for controlling the amount of air induced out of air flow path 168. In other embodiments, building heat outlet duct 128 may not be provided with an outlet damper assembly.

In some embodiments, cryptocurrency miner 104 may not include a building heat outlet duct 128, but may instead include a driveway heat outlet duct 140. Driveway heat outlet duct 140 may be fluidly coupled to a driveway heating duct 34 to induce air flow from furnace housing 132 to the driveway heating duct 34.

In the illustrated example, cryptocurrency miner 104 includes a heat exhaust duct 136. In other embodiments, cryptocurrency miner 104 may include a greater number (e.g., 2 to 8) of heat exhaust ducts. This may allow larger amounts of air to be induced out of furnace housing 132 to the exterior environment of building 14.

Heat exhaust duct 136 can be fluidly coupled to the exterior environment of building 14 to induce air flow from furnace housing 132 to the exterior environment. This may permit warm air from cryptocurrency miner 104 to be exhausted to the exterior environment of building 14 when only a portion (or none) of the warm air from cryptocurrency miner 104 is required for heating building 14.

Heat exhaust duct 136 can have any design suitable for inducing air out of air flow path 168. For example, heat exhaust duct 136 may include one or more of ducts, louvers, hood or awning assemblies. In some embodiments, heat exhaust duct 136 may be provided with an outlet damper assembly for controlling the amount of air induced out of air flow path 168. In other embodiments, heat exhaust duct 136 may not be provided with an outlet damper assembly.

Transformer 164 may be positioned within furnace housing 132 in air flow path 168. In some embodiments, transformer 164 may be positioned in air flow path 168 downstream of air inlet ducts 124 and upstream of mining computers 106.

Transformer 164 can have any suitable design to receive electrical power (e.g., from electric power input 116) and provide electrical power to the other elements of cryptocurrency miner 104 including principal fan 120 and mining computers 106. For example, transformer 164 can be a voltage step-down transformer.

Principal fan 120 may be positioned within furnace housing 132 in air flow path 168. Principal fan 120 can have any design suitable for inducing air flow along air flow path 168 from air inlet ducts 124, through transformer 164 and mining computers 106, to building heat outlet duct 128 and/or heat exhaust duct 136.

In the illustrated example, cryptocurrency miner 104 includes a single principal fan 120. Specifically, principal fan 120 can be the only fan in furnace housing 132 located upstream or downstream of mining computers 106. As compared to several smaller fans of equal combined fan power, the single principal fan may have larger blades that spin slower and may generate less noise (and lower pitched noise) and operate more efficiently.

In some embodiments, principal fan 120 may be a centrifugal backwards curved fan that may provide significant energy savings compared with other designs. In other embodiments, principal fan 120 may not be a centrifugal backwards curved fan. For example, a different fan design may be used because of size or cost constraints.

In some embodiments, furnace housing 132 may include an air guide or deflector 184. Deflector 184 may have any design suitable to redirect air flow exiting principal fan 120 towards mining computers 106. In the absence of deflector 184, air flow exiting principal fan 120 may hit walls of furnace housing 132 causing vibration and/or noise. In the illustrated example, deflector 184 is formed as a surface that surrounds principal fan 120 and deflects air flow exiting principal fan 120 upwards towards mining computers 106. In other embodiments, furnace housing 132 may not include deflector 184 and the design of principal fan 120 may be modified to redirect exiting air flow towards mining computers 106.

In some embodiments, furnace housing 132 may include any suitable number of noise cancelling panels 188. For example, furnace housing 132 may include four noise cancelling panels 188 (one on each vertical side of furnace housing 132 and two of which, 188a and 188b, are shown in FIG. 7) surrounding at least a portion (and preferably a majority or entirety) of the interior of furnace housing 132. In other embodiments, furnace housing 132 may not include any noise cancelling panels 188.

Noise cancelling panel 188 can have any design suitable for reducing noise generated within furnace housing 132 from travelling outside furnace housing 132. In some embodiments, a noise cancelling panel 188 may include a foam and foil style glue back insulation. In other embodiments, noise cancelling panel 188 may include sheet metal or fabric style insulation material.

Figure 8A:
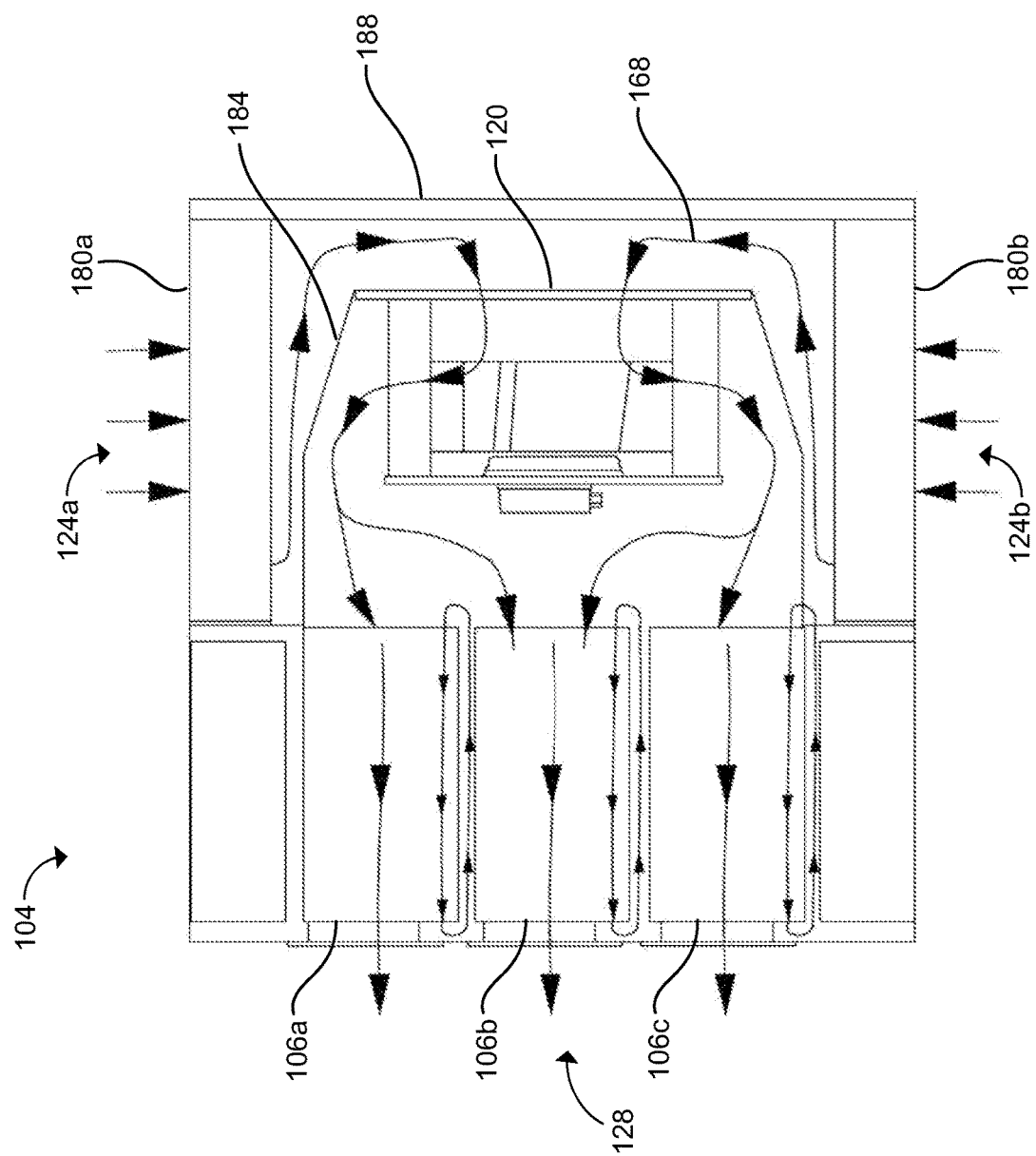
FIG. 8A is a schematic cross-sectional view of another cryptocurrency mining furnace in accordance with an embodiment.
Figure 8B:
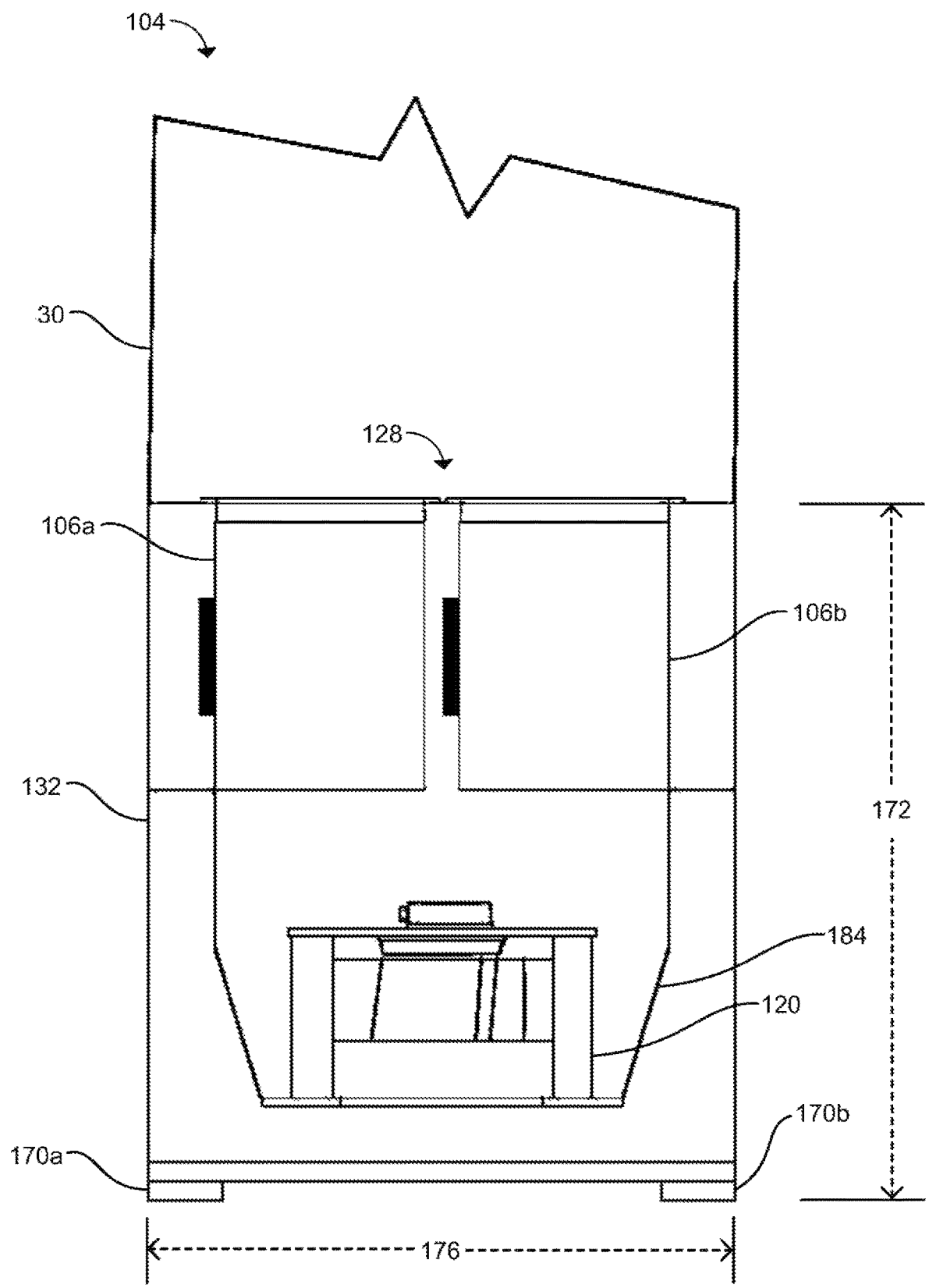
FIG. 8B is a schematic cross-sectional view of another cryptocurrency mining furnace in accordance with an embodiment.
Figure 8C:
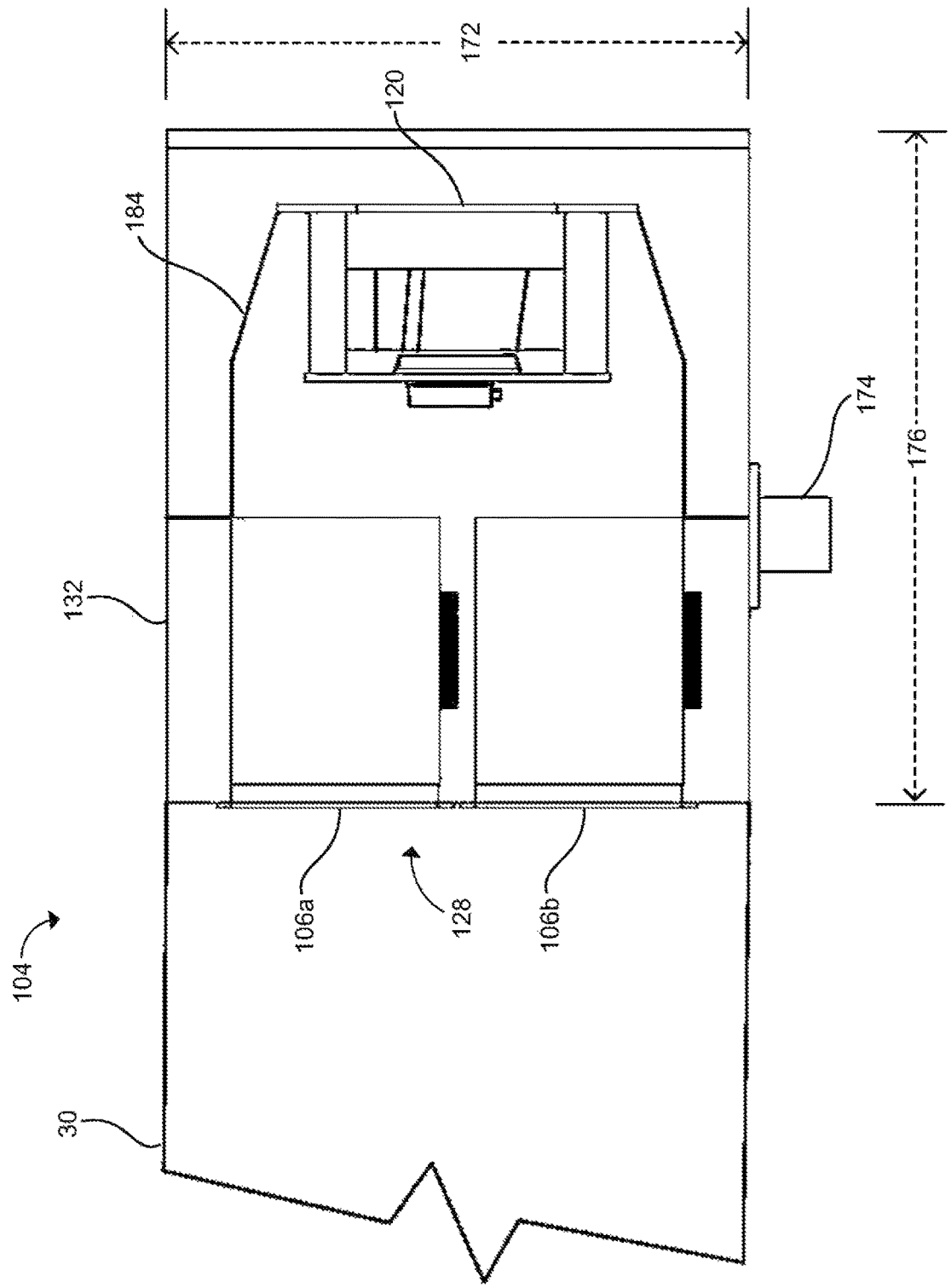
FIG. 8C is a schematic cross-sectional view of another cryptocurrency mining furnace in accordance with an embodiment.

Referring now to FIGS. 8A-8C, shown therein are schematic cross-sectional views of example embodiments of a cryptocurrency miner 104 that is a cryptocurrency mining furnace (e.g., cryptocurrency miner 104a shown in FIG. 3). As described herein above with reference to FIG. 3, cryptocurrency miners 104 illustrated in FIGS. 8A-8C can provide functionalities including functionalities provided by a space heater. In the illustrated examples, cryptocurrency miner 104 includes mining computers 106, a principal fan 120, air inlet ducts 124a and 124b, a building heat outlet duct 128, and a furnace housing 132.

Cryptocurrency miner 104 may be configured to enable integration with pre-existing building ducts 30 in different orientations. FIG. 8B shows an example where cryptocurrency miner 104 includes floor mounting feet 170a and 170b to enable integration of cryptocurrency miner 104 with a building duct 30 that is vertically oriented. In the illustrated example, principal fan 120 can induce air flow through mining computers 106 and out through building heat outlet duct 128 to the vertically oriented building duct 30.

FIG. 8C shows an example where cryptocurrency miner 104 includes wall mounting bracket 174 to enable integration of cryptocurrency miner 104 with a building duct 30 that is horizontally oriented. In the illustrated example, principal fan 120 can induce air flow through mining computers 106 and out through building heat outlet duct 128 to the horizontally oriented building duct 30.

Furnace housing 132 may define an air flow path 168 extending downstream from air inlet ducts 124 to building heat outlet duct 128. As shown in FIG. 7, air flow path 168 may pass through principal fan 120 and mining computers 106.

Furnace housing 132 may have any design that provides an enclosure suitable for housing the elements of cryptocurrency miner 104. Cryptocurrency miner 104 shown in FIGS. 8A-8C may provide a more compact design and smaller footprint compared with cryptocurrency miner 104 shown in FIG. 7. As illustrated in FIGS. 8A-8C, cryptocurrency miner 104 may not include a transformer. Furnace housing 132 may have a furnace height 172 of 1000 mm or less (e.g., 600 mm-1000 mm), and a furnace width 176 of 700 mm or less (e.g., 400 mm-700 mm). A furnace of this size may provide a compact design suited for indoor installation in residential buildings. For example, cryptocurrency mining furnace 104 may be positioned within an indoor space to heat the indoor air in the manner of a space heater.

In the illustrated example, cryptocurrency miner 104 includes two air inlet ducts 124a and 124b. In other embodiments, cryptocurrency miner 104 may include greater than two (e.g., 2-8) air inlet ducts. This may allow larger amounts of air to be induced into air flow path 168.

Air inlet ducts 124a and 124b may be fluidly coupled to building 14 to induce air from interior of building 14 into air flow path 168. Air inlet ducts 124 can have any design suitable for admitting air into air flow path 168. For example, air inlet ducts 124 may include one or more of ducts, louvers, hood or awning assemblies. In some embodiments, air inlet ducts 124 may not include any damper assemblies to provide a compact design and limit the footprint of cryptocurrency miner 104. In other embodiments, air inlet ducts 124 may include an inlet damper assembly. In some embodiments, air inlet ducts 124 may remain disconnected from any building ducting. This may allow cryptocurrency mining furnace 104 to be positioned within an indoor space to heat the indoor air in the manner of a space heater.

In some embodiments, cryptocurrency miner 104 may include air filters 180 positioned in furnace housing 132 in air flow path 168 upstream of principal fan 120. Air induced through air inlet ducts 124 into furnace housing 132 may include dust particles that can attach to and clog up various components of cryptocurrency miner 104. Air filters 180 can filter out at least a portion of the dust particles from air induced through air inlet ducts 124 and protect various components of cryptocurrency miner 104.

In the illustrated examples, cryptocurrency miner 104 includes a building heat outlet duct 128. In other embodiments, cryptocurrency miner 104 may include a greater number (e.g., 2 to 8) of building heat outlet ducts. This may allow larger amounts of air to be induced out of furnace housing 132 to building 14.

Building heat outlet duct 128 can be fluidly coupled to building 14 to induce air flow from furnace housing 132 to interior of building 14. This may permit warm air from cryptocurrency miner 104 to be induced into interior environment of building 14 to provide heating for building 14.

Building heat outlet duct 128 can have any design suitable for inducing air out of air flow path 168. For example, building heat outlet duct 128 may include one or more of ducts, louvers, hood or awning assemblies. In some embodiments, building heat outlet duct 128 may not include any damper assemblies to provide a compact design and limit the footprint of cryptocurrency miner 104. In other embodiments, building heat outlet duct 128 may include an outlet damper assembly.

In some embodiments, building heat outlet duct 128 may remain disconnected from any building ducting. This may allow cryptocurrency mining furnace 104 to be positioned within an indoor space to heat the indoor air in the manner of a space heater. The cryptocurrency mining furnace 104 may include an input control (e.g., a switch, a button etc.) to select a desired heating level (e.g., low, medium, high). In response to the selected heating level, cryptocurrency mining furnace 104 may adjust the intensity levels of mining computers 106 such that heating provided to the building matches the desired heating level. Cryptocurrency mining furnace can optimize the cryptocurrency mining operations by adjusting the intensity levels of each mining computer 106 instead of merely powering off some miners based on the desired heating level.

Principal fan 120 may be positioned within furnace housing 132 in air flow path 168. Principal fan 120 can have any design suitable for inducing air flow along air flow path 168 from air inlet ducts 124, through mining computers 106, to building heat outlet duct 128.

In the illustrated examples, cryptocurrency miner 104 includes a single principal fan 120. Specifically, principal fan 120 can be the only fan in furnace housing 132 located upstream or downstream of mining computers 106. As compared to several smaller fans of equal combined fan power, the single principal fan may have larger blades that spin slower and may generate less noise (and lower pitched noise) and operate more efficiently.

In some embodiments, principal fan 120 may be a centrifugal backwards curved fan that may provide significant energy savings compared with other designs. In other embodiments, principal fan 120 may not be a centrifugal backwards curved fan. For example, a different fan design may be used because of size or cost constraints.

In some embodiments, furnace housing 132 may include an air guide or deflector 184. Deflector 184 may have any design suitable to redirect air flow exiting principal fan 120 towards mining computers 106. In the absence of deflector 184, air flow exiting principal fan 120 may hit walls of furnace housing 132 causing vibration and/or noise. In the illustrated example, deflector 184 is formed as a surface that surrounds principal fan 120 and deflects air flow exiting principal fan 120 towards mining computers 106. In other embodiments, furnace housing 132 may not include deflector 184 and the design of principal fan 120 may be modified to redirect exiting air flow towards mining computers 106.

In some embodiments, furnace housing 132 may include one or more noise cancelling panels 188. Noise cancelling panel 188 can have any design suitable for reducing noise generated within furnace housing 132 from travelling outside furnace housing 132. In some embodiments, a noise cancelling panel 188 may include a foam and foil style glue back insulation. In other embodiments, noise cancelling panel 188 may include sheet metal or fabric style insulation material. In other embodiments, furnace housing 132 may not include any noise cancelling panels 188.

Figure 8D:
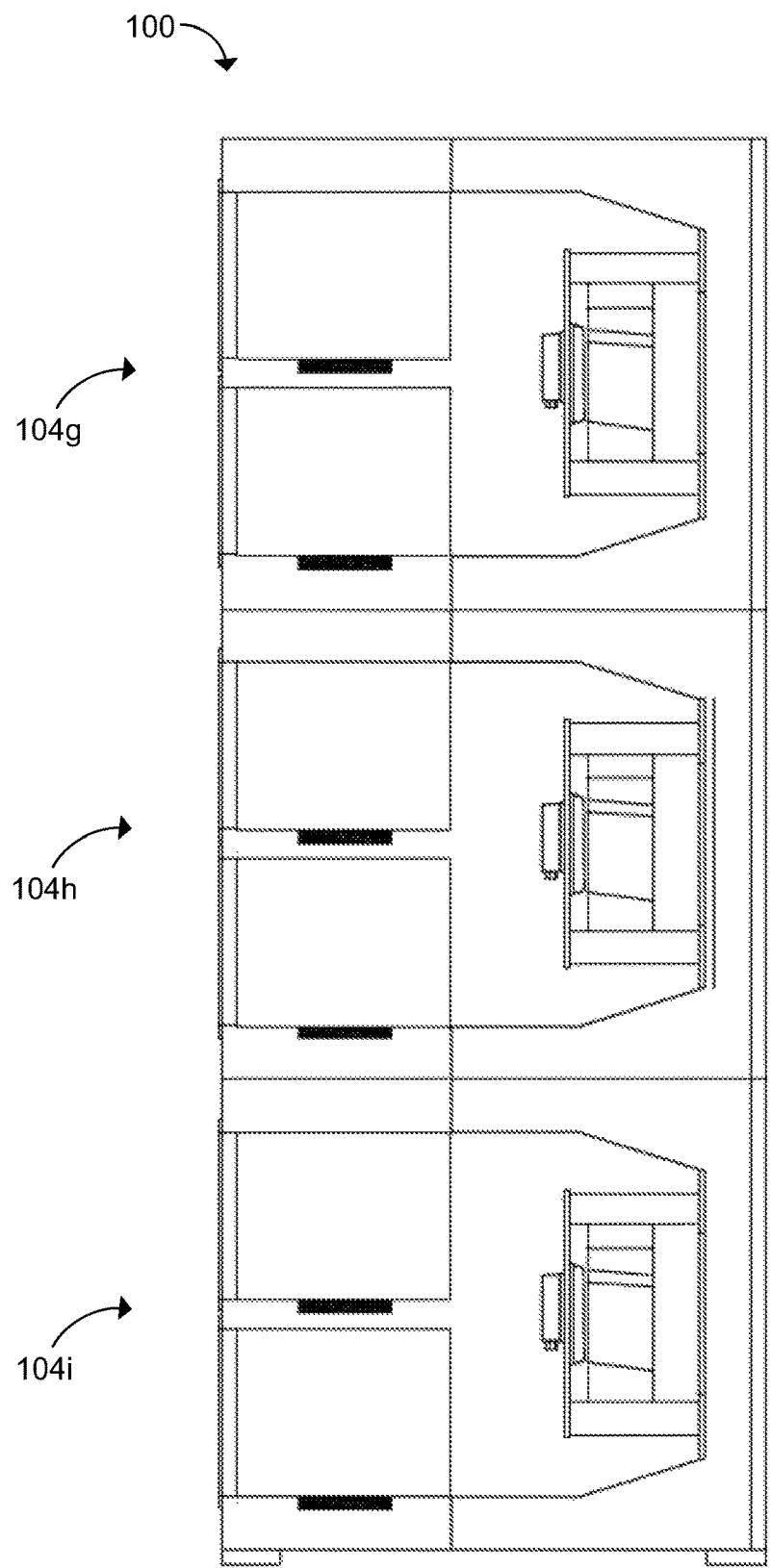
FIG. 8D is a schematic cross-sectional view of another example hybrid apparatus in accordance with an embodiment.

Reference is now made to FIG. 8D showing a schematic cross-sectional view of an example hybrid apparatus 100 that includes multiple cryptocurrency mining furnaces 104 stacked together to provide greater heating capacity. As described herein above with reference to FIG. 3 and FIGS. 8A-8C, cryptocurrency mining furnaces 104 illustrated in FIG. 8D can provide functionalities including functionalities provided by space heaters. Hybrid apparatus 100 may include any suitable number of cryptocurrency mining furnaces 104 stacked together, for example 2 to 6. In the illustrated example, hybrid apparatus 100 includes three cryptocurrency mining furnaces 104g-104i stacked vertically. In other example, the cryptocurrency mining furnaces 104 may be stacked in a different orientation, for example, horizontally.

The stacked arrangement may provide more efficient utilization of available space when multiple cryptocurrency mining furnaces are required to provide sufficient furnace operations. Additionally, the stacked arrangement may enable reduction in electrical cable requirements thereby reducing cost and/or complexity of the hybrid apparatus.

Figure 8E:
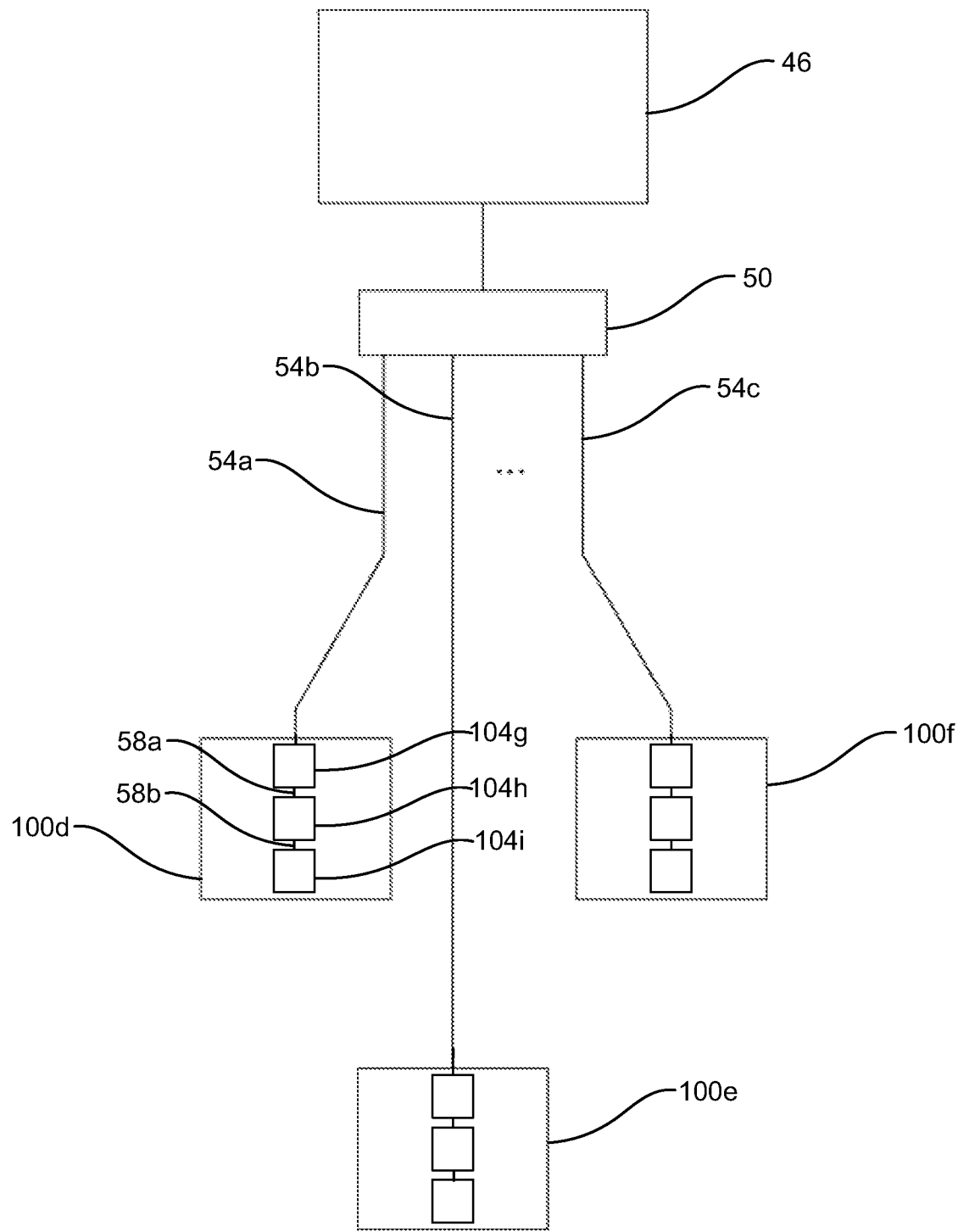
FIG. 8E is a schematic diagram of power distribution to example hybrid apparatuses in accordance with an embodiment.

Reference is now made to FIG. 8E showing an example schematic diagram of power distribution to hybrid apparatuses 100d-100f. Hybrid apparatuses 100d-100f may receive input power from transformer 46 via distribution panel 50. Transformer 46 can, for example, be a transformer with a 416/240V secondary. In the illustrated example, each hybrid apparatus 100d-100f includes three cryptocurrency mining furnaces 104. For example, hybrid apparatus 100d includes cryptocurrency mining furnaces 104g-104i. As described herein above with reference to FIG. 3 and FIGS. 8A-8D, cryptocurrency mining furnaces 104g-104i can provide functionalities including functionalities provided by space heaters.

A single power cable 54a can be sufficient to supply electric input power from distribution panel 50 to cryptocurrency mining furnaces 104g-104i. For example, power cable 54a may be connected between distribution panel 50 and cryptocurrency mining furnace 104g. Shorter jumper cables 58a and 58b may be connected between cryptocurrency mining furnaces 104g and 104h, and between cryptocurrency mining furnaces 104h and 104i respectively. This may enable a reduction in power cable requirements (and associated cost/complexity) compared with using dedicated power cables 54 to each cryptocurrency mining furnace 104g-104i.

Figure 9:
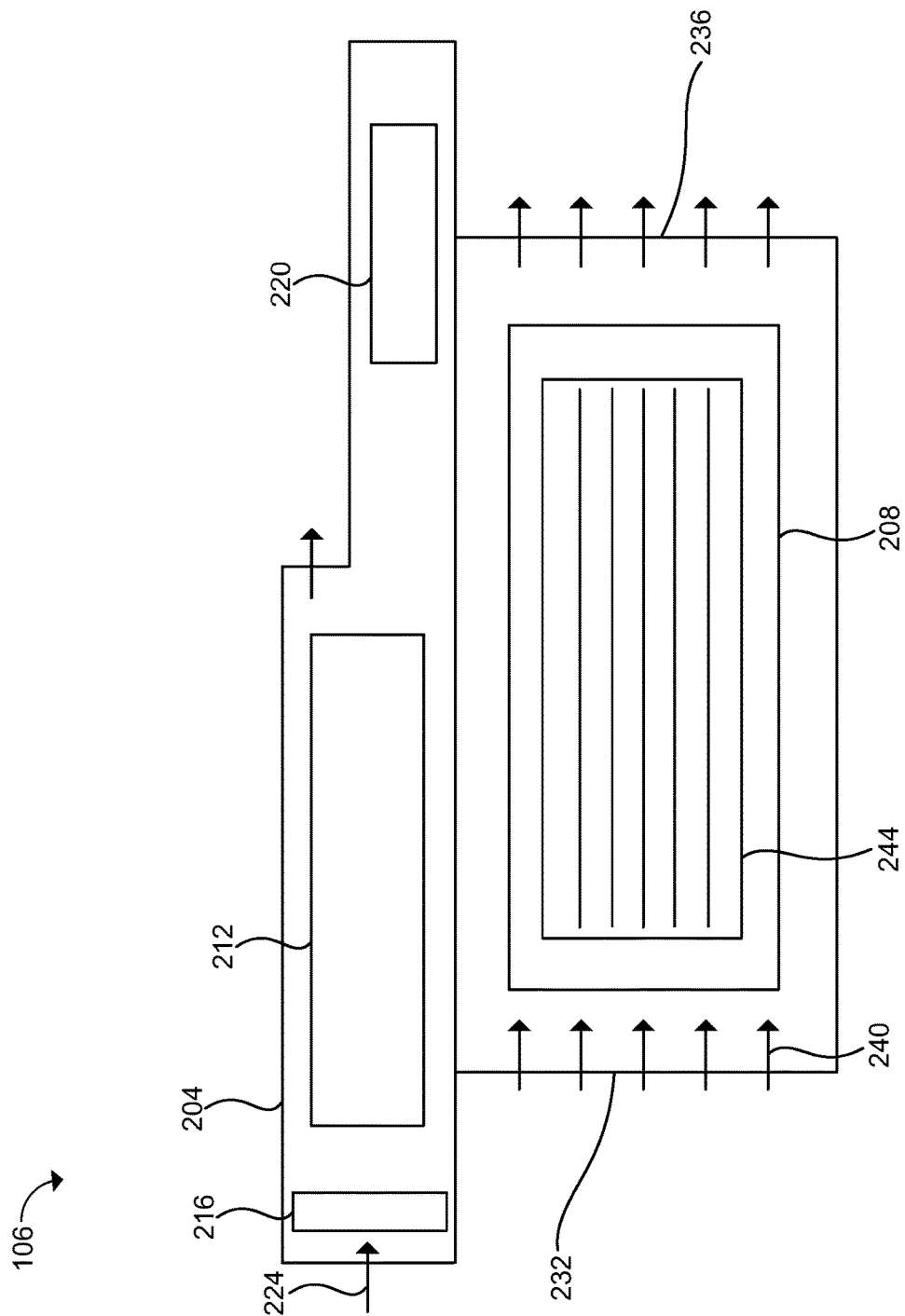
FIG. 9 is a schematic illustration of a mining computer adapted for use in the cryptocurrency miners of FIGS. 7 and 8.

Reference is now made to FIGS. 7 to 9. FIG. 9 shows a schematic illustration of a mining computer 106 adapted for use in cryptocurrency miners 104 shown in FIGS. 7 and 8.

Cryptocurrency miner 104 may include any suitable number of mining computers 106 positioned within furnace housing 132 in air flow path 168. For example, cryptocurrency miner 104 may include 2-1500 mining computers 106 (e.g., 15-60 mining computers 106). A greater number of mining computers 106 (e.g., 20 or more) may require a higher initial capital expenditure cost but may provide higher mining rates for cryptocurrency miner 104. A lower number of mining computers 106 (e.g., 3-20) may be more compact and easier to accommodate inside a building, particularly if configured as a space heater.

Mining computers 106 can have any design suitable for performing cryptocurrency mining operations. In some embodiments, mining computers 106 may belong to the Whatsminer® series of mining computers. For example, the mining computers may belong to the M20, M30 or M50 series of Whatsminer® mining computers. In other embodiments, mining computers 106 may not belong to the Whatsminer® series of mining computers. For example, the mining computers may belong to the Bitmain Antminer® S19 series of mining computers including S19, S19 Pro, S19 XP, S19j Pro, S19j Pro+, S19k Pro, etc. or any other series of mining computers or any generic computers suitable for performing cryptocurrency mining operations.

In some embodiments, mining computers 106 can be replaced by server computers 106 that have any design suitable for performing general-purpose or specialized computing tasks. For example, server computers 106 can have any design suitable for performing AI processing tasks. In some embodiments, server computers 106 can be NVIDIA® V100 Tensor Core GPUs. In other embodiments, server computers 106 can be any other series of processors specialized for performing AI processing tasks or any generic processors suitable for performing AI processing tasks.

As shown in FIG. 9, mining computer 106 may include one or more (or all) of a computer housing 204, a cryptocurrency mining board 208, a computer power supply 212, a power supply fan 216 and a computer control board 220.

Computer control board 220 can have any design suitable for controlling various operations of mining computer 106. In some embodiments, computer control board 220 may control various operations of cryptocurrency mining board 208, computer power supply 212 and power supply fan 216. For example, computer control board 220 may control the mining operations of cryptocurrency mining board 208. In some embodiments, computer control board 220 may also enable network communication for mining computer 106 to communicate with external devices and servers during the cryptocurrency mining operations.

In some embodiments, computer control board 220 may be in communication with power coordinator 112 (shown in FIGS. 1 to 6). Power coordinator 112 may provide instructions to computer control board 220 to control cryptocurrency mining operations performed by mining computer 106.

Computer power supply 212 can have any design suitable for providing power supply to different components of mining computer 106 including one or more (or all) of cryptocurrency mining board 208, power supply fan 216 and computer control board 220. In some embodiments, computer power supply 212 may receive 240V AC input power supply and provide suitable DC output power supply to one or more (or all) of cryptocurrency mining board 208, power supply fan 216 and computer control board 220.

Power supply fan 216 can have any design suitable for providing air cooling of computer power supply 212. Power supply fan 216 may induce air flow 224 to provide cooling for computer power supply 212. The air flow induced by the principal fan may cause the power supply fans 216 to overspeed and generate loud, high-frequency noise. Accordingly, in some embodiments, power supply fan 216 may be positioned outside of air flow path 168 and may not induce air flow along air flow path 168. In some embodiments, mining computer 106 may not include power supply fan 216. This may permit reduction in power consumed and noise generated by mining computer 106.

Computer housing 204 may provide an enclosure for the various components of mining computer 106 including cryptocurrency mining board 208, computer power supply 212, power supply fan 216 and computer control board 220. In some embodiments, computer housing 204 may include at least one mining board section air inlet 232 and at least one mining board section air outlet 236.

Air flow 240 may be a portion of air flow induced along air flow path 168 by principal fan 120. Air flow 240 may flow into computer housing 204 at mining board section air inlet 232, provide air cooling of cryptocurrency mining boards 208 positioned inside computer housing 204 and flow out of computer housing 204 at mining board section air outlet 236.

Mining computer 106 may include any number of cryptocurrency mining boards 208 (e.g., 1 to 8 cryptocurrency mining boards 208). In some embodiments, mining computer 106 may include three cryptocurrency mining boards 208. This may enable mining computer 106 to have sufficient processing power to profitably mine cryptocurrency. In other embodiments, mining computer 106 may include one or two cryptocurrency mining boards 208. This may enable reduction in power consumption of mining computer 106. In other embodiments, mining computer 106 may include more than three cryptocurrency mining boards 208 (e.g., 4-8 cryptocurrency mining boards 208). This may enable higher processing power for mining computer 106.

Cryptocurrency mining board 208 can have any design suitable for performing cryptocurrency mining operations. In some embodiments, cryptocurrency mining board 208 may include any processing device suitable for contributing computing power for running a hashing algorithm for mining cryptocurrency. For example, the processing device may include a central processing unit (CPU), a graphical processing unit (GPU), a field programmable gate array (FPGA) or an application specific integrated circuit (ASIC). In the illustrated example, cryptocurrency mining board 208 may be a hashboard. In many cases, a hashboard may provide better mining power efficiency (i.e., a lower power consumption to mining hashrate ratio) than other options. In other embodiments, cryptocurrency mining board 208 may not be a hashboard.

In some embodiments, cryptocurrency mining board 208 may include heatsink structures 244 to dissipate heat generated during cryptocurrency mining operations. Air flow 240 may flow through the space around the heat sink structures 244 transporting heat energy away from mining computers 106.

In some embodiments, a maximum hashrate of mining computer 106 may be greater than 50 Th/s, such as for example 50 Th/s to 1500 Th/s (e.g., 68 Th/s to 126 Th/s). The higher hashrates may permit faster mining of cryptocurrency by mining computer 106. In other embodiments, the hashrate of mining computer 106 may be less than 50 Th/s (e.g., 30 Th/s to 50 Th/s). This may enable mining computer 106 to operate at lower power consumption levels. Alternatively, the hashrate of mining computer 106 may be greater than 150 Th/s. This may enable mining computer 106 to mine cryptocurrency at higher rates.

A maximum power consumption of mining computer 106 may be greater than 2000 W, such as for example 2000 W to 5000 W (e.g., 3200 W to 3750 W). Mining computer 106 with higher power consumption can typically provide higher hashrates and faster mining of cryptocurrency. In other embodiments, the maximum power consumption of mining computer 106 may be less than 2000 W (e.g., 1500 W to 2000 W). This may enable operation of cryptocurrency miner 104 with reduced cooling air flow requirements and reduced noise levels. Alternatively, the maximum power consumption of mining computer 106 may be greater than 5000 W (e.g., 5000 W to 10000 W). This may enable mining computer 106 to provide higher hashrates and faster mining of cryptocurrency.

In some embodiments, mining computer 106 may be operated in an overclocked configuration that consumes at least 5% (e.g., 10%-50%) more power compared with a non-overclocked operation. This may permit mining computer 106 to operate at higher hashrates but at the cost of higher power consumption resulting in higher heat generation.

Mining computer 106 may have an adjustable intensity level indicating an intensity at which mining computer 106 is running. The intensity level may be adjusted by adjusting operating frequency, voltage, power and/or temperature of mining computer 106. For example, computer control board 220 may adjust intensity level of mining computer 106 in response to instructions received from power coordinator 112 (shown in FIGS. 1 to 6). In some embodiments, the operating frequency and voltage may be directly adjusted (e.g., by computer control board 220), the temperature may be directly adjusted by controlling air flow (e.g., by controlling air flow 240), and the power may be indirectly adjusted by adjusting one or more of the operating frequency, voltage and temperature.

At a higher intensity level, mining computer 106 may have a higher power consumption and provide a higher cryptocurrency mining rate (e.g., a higher hashrate (Th/s)). At a lower intensity level, mining computer 106 may have a lower power consumption and provide a lower cryptocurrency mining rate (e.g., a lower hashrate (Th/s)).

Different mining computers 106 may have different mining rates at their highest intensity levels. In one example, a maximum mining rate (e.g., 70 Th/s) of a first mining computer at its highest intensity level may be less than (e.g., 75% of) the maximum mining rate (e.g., 110 Th/s) of a second mining computer at its highest intensity level.

Cryptocurrency miner 104 may have a maximum miner power draw from electric power input 116 (shown in FIGS. 1 to 6). The maximum miner power draw may be associated with each of mining computers 106 of cryptocurrency miner 104 operating at their respective highest intensity level. The maximum miner power draw may be less than the rated maximum power capacity of electric power input 116 (shown in FIGS. 1 to 6). Accordingly, electric power input 116 can supply sufficient power to run cryptocurrency miner 104 with all of the mining computers 106 operating at their highest intensity level.

In alternative embodiments, the maximum miner power draw may be greater than the rated maximum power capacity of electric power input 116 (shown in FIGS. 1 to 6).

The increased power consumption at higher intensity levels may cause a reduced mining rate power efficiency (mining rate per watt, e.g., Th/s per watt) of mining computer 106. Accordingly, mining computer 106 may mine larger amount of cryptocurrency when operated at higher intensity levels, but the mining rate power efficiency may be reduced. In contrast, the reduced power consumption at lower intensity levels may cause an increase in mining rate power efficiency (mining rate per watt, e.g., Th/s per watt) of mining computer 106. Accordingly, mining computer 106 may mine reduced amount of cryptocurrency when operated at lower intensity levels, but the mining rate power efficiency may be increased.

Figure 10:
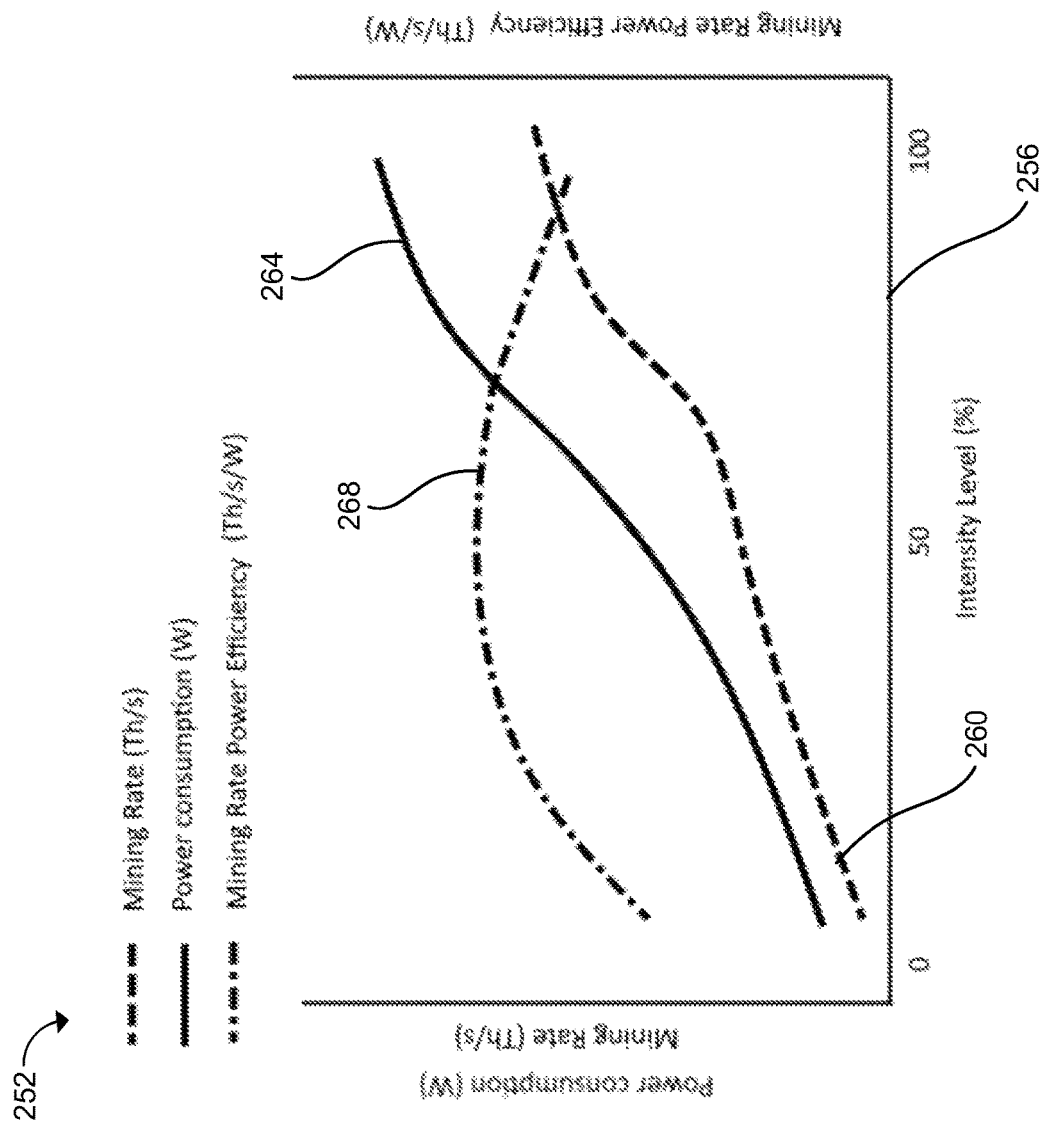
FIG. 10 is an example graphical representation of an intensity level to mining rate power efficiency characteristic of the mining computer of FIG. 9.

Referring now to FIG. 10, shown therein is an example graphical representation 252 of an intensity level to mining rate power efficiency characteristic of mining computer 106. Example graph 252 shows how cryptocurrency mining rates (Th/s), power consumption (W), and mining rate power efficiency (Th/s/W) vary according to the intensity level of mining computer 106. Intensity levels, as a percentage of maximum intensity level, are plotted along x-axis 256. The y-axes include mining rate (Th/s), power consumption (W), and mining rate power efficiency (Th/s/W). Each of mining rate, power consumption, and mining rate power efficiency may be linearly (i.e., straight line) or non-linearly (e.g., curved line) related to intensity level. Generally, mining rate and power consumption both positively correlated with intensity level (i.e., increase with increasing intensity level and vice versa). Graph 252 shows an example in which each of mining rate (curve 260) and power consumption (curve 264) increase exponentially relative to the intensity level of mining computer 106.

Mining rate power efficiency is calculated by dividing the mining rate by the power consumption. Depending on the relationship between each of the mining rate and power consumption to intensity level, the relationship between mining rate power efficiency and intensity level may be either linear or non-linear relationship, and may either be positively correlated to intensity level or negatively correlated to intensity level. In general, mining rate power efficiency is negatively correlated to intensity level for at least a majority of intensity levels (e.g., from less than 50% intensity level to 100% intensity level). An example is shown by curve 268 in graph 252 in which mining rate power efficiency is shown as decreasing with increasing intensity level of mining computer 106.

Different mining computers may have different mining rate power efficiency characteristics. That is, the relationships between cryptocurrency mining rates, mining rate power efficiency, and mining rate power efficiency and intensity levels may differ between mining computers. For example, even where two mining computers have the same maximum power consumption and mining rates, those two mining computers may have different mining rates, power consumption, and mining rate power efficiency when operating at a 75% intensity level.

Figure 11:
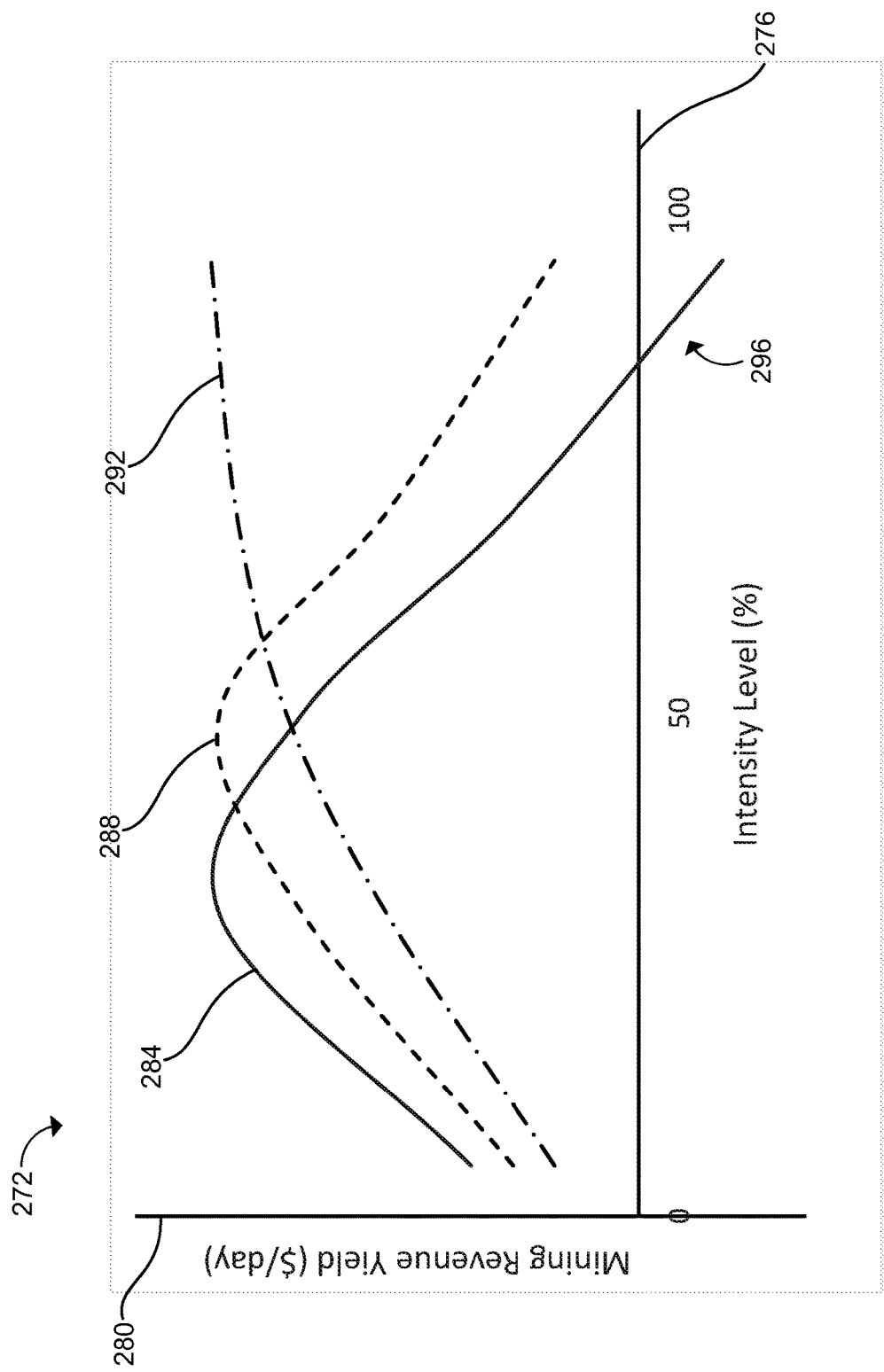
FIG. 11 is an example graphical representation of a cryptocurrency mining revenue yield versus intensity levels of the mining computer of FIG. 9.

Referring now to FIG. 11, shown therein is an example graphical representation 272 of an intensity level to cryptocurrency mining revenue yield characteristic of mining computer 106. Example graph 272 shows how cryptocurrency mining revenue yield ($/day) varies according to the intensity level of mining computer 106. Intensity levels, as a percentage of maximum intensity level, are plotted along x-axis 276. The y-axis 280 includes the cryptocurrency mining revenue yield ($/day). The cryptocurrency mining revenue yields may be determined based on the mining rate power efficiency characteristic of mining computer 106, a valuation of the cryptocurrency, and a cost of electric power. The mining revenue yield may be determined, for example, using the equation below.

Mining Revenue Yield ($/day)=(Cryptocurrency valuation ($/Th)*Mining rate (Th/s)*86,400 s/day)−(Cost of electric power ($/Wh)*Power consumption (W)*24 h/day)

The cryptocurrency mining revenue yield may be linearly (i.e., straight line) or non-linearly (e.g., curved line) related to intensity level. In some cases, the cryptocurrency mining revenue yield may peak at an intermediate intensity level. For example, curves 284 and 288 of graph 272 shows examples where the cryptocurrency mining revenue yield may peaks at less than the maximum intensity level. At lower intensity levels, mining computer 106 may operate at higher mining rate power efficiency but lower mining rate to yield a lower cryptocurrency mining revenue yield. At higher intensity levels, mining computer 106 may operate at higher mining rate but at lower mining rate power efficiency to yield a lower cryptocurrency mining revenue yield.

The peak of the cryptocurrency mining revenue yield may shift based on the values of the mining rate power efficiency characteristic of mining computer 106, valuation of the cryptocurrency, and cost of electric power. For example, as cost of electric power increases, the peak may shift to lower intensity levels (e.g., curve 284). As another example, as valuation of the cryptocurrency increases, the peak may shift to higher intensity levels (e.g., curve 288). In some cases, the cryptocurrency mining revenue yield may be negative at high intensity levels for high cost of electric power and a low valuation of the cryptocurrency (e.g., portion 296 of curve 284).

In some embodiments, the mining rate power efficiency characteristic of mining computer 106 may change over a period of time. For example, mining computer 106 may consume higher amounts of power to provide the same mining rate as the mining computer 106 increases in age. The age of mining computer 106 is based on the number of hours mining, and the intensity level of each hour of mining where a higher intensity level increases the age of the mining computer 106 more quickly than lower intensity levels.

Accordingly, the mining rate power efficiency characteristic of mining computer 106 may shift downward with age. This may cause the peak of the cryptocurrency mining revenue yield of mining computer 106 to shift to lower intensity levels with age/usage hours. This loss of mining rate power efficiency with age may be quantified and referred to as the computer depreciation of mining computer 106. An intensity level to computer depreciation characteristic of mining computer 106 may be used to describe the change in mining rate power efficiency characteristic and cryptocurrency mining revenue yield of mining computer 106 with age, where the age of mining computer 106 increases more rapidly at higher intensity levels.

In other examples, the cryptocurrency mining revenue yield may have multiple peaks or may not have any distinctive peaks. For example, curve 292 of graph 272 starts to plateau at higher intensity levels close to 100%, but does not include a distinctive peak like curves 284 and 288. The nature of the cryptocurrency mining revenue yield graph may depend on the relative values of the mining rate power efficiency characteristic of mining computer 106, valuation of the cryptocurrency, and cost of electric power.

Reference is now made to FIGS. 1 to 6. Power coordinator 112 may have any design suitable to perform various functions including determining mining power availability within the rated maximum power capacity of electric power input 116 and adjusting intensity levels of mining computers 106. Power coordinator 112 may be implemented using any combination of hardware and/or software components. For example, power coordinator 112 may be implemented using a programmable logic controller (PLC), a field programmable gate array (FPGA) or any other processor capable of executing instructions stored on a memory device coupled with the processor.

In some embodiments, power coordinator 112 may receive input signals indicating the rated maximum power capacity of electric power input 116, power draw of EV charger 108 (if present in hybrid apparatus 100), and/or power draw of cryptocurrency miner 104. For example, power coordinator 112 may receive the input signals from power meters 118. In some embodiments, power coordinator 112 may retrieve one or more of the rated maximum power capacity and/or the power draws from a memory location accessible by power coordinator 112.

In some embodiments, the rated maximum power capacity of electric power input 116 may be less than a sum of the maximum charger power draw and the maximum miner power draw (e.g. 40% to 80% of the sum). In such cases, the maximum charger power draw and the maximum miner power draw may not be simultaneously available. Accordingly, power coordinator 112 may be operable to allocate the available power between EV charger 108 and cryptocurrency miner 104 as described herein.

Power coordinator 112 may be configured to determine mining power availability within the rated maximum power capacity after prioritizing power demand by EV charger 108. As one example, the rated maximum power capacity may be 250 kW, the maximum charger power draw may be 200 kW and the maximum miner power draw may be 150 kW. In response to a charger power draw of 150 kW, power coordinator 112 may determine mining power availability to be 100 kW.

Power coordinator 112 may be configured to direct cryptocurrency miner 104 to continue mining cryptocurrency by adjusting the intensity levels of mining computers 106 such that cryptocurrency miner 104 consumes not more than the mining power availability. Power coordinator 112 may adjust the intensity levels of mining computers 106 such that a total revenue yield of all the mining computers is maximized while total power consumption of the mining computers does not exceed the mining power availability.

In some embodiments, power coordinator 112 may receive a target furnace heating level. Power coordinator 112 may determine a target power consumption level of mining computers 106 based on the target furnace heating level. If the target power consumption level exceeds the mining power availability, power coordinator 112 may adjust the intensity levels of mining computers 106 such that cryptocurrency miner 104 consumes not more than the mining power availability. If the target power consumption level does not exceed the mining power availability, power coordinator 112 may adjust the intensity levels of mining computers 106 such that cryptocurrency miner 104 consumes not more than the target power consumption level. Power coordinator 112 may adjust the intensity levels of mining computers 106 such that a total revenue yield of all the mining computers is optimized (e.g., maximized) while total power consumption of the mining computers does not exceed the corresponding threshold (mining power availability and/or target power consumption level based on target furnace heating level).

In some embodiments, hybrid apparatus 100 may not include EV charger 108 and the entire rated maximum power capacity of electric power input 116 may be available for cryptocurrency mining. If power coordinator 112 receives a target furnace heating level, power coordinator 112 can determine a target power consumption level of mining computers 106 based on the target furnace heating level. If the target power consumption level exceeds the rated maximum power capacity of electric power input 116 (or if power coordinator 112 does not receive a target furnace heating level), power coordinator 112 may adjust the intensity levels of mining computers 106 such that cryptocurrency miner 104 consumes not more than the rated maximum power capacity of electric power input 116. If the target power consumption level does not exceed the rated maximum power capacity of electric power input 116, power coordinator 112 may adjust the intensity levels of mining computers 106 such that cryptocurrency miner 104 consumes not more than the target power consumption level. Power coordinator 112 may adjust the intensity levels of mining computers 106 such that a total revenue yield of all the mining computers is optimized (e.g., maximized) while total power consumption of the mining computers does not exceed the corresponding threshold (rated maximum power capacity of electric power input 116 and/or target power consumption level based on target furnace heating level).

In some embodiments, power coordinator 112 may determine cryptocurrency mining revenue yields versus intensity levels (for example, graph 284 of FIG. 11) for each mining computer 106 of cryptocurrency miner 104. Power coordinator 112 may determine the cryptocurrency mining revenue yields versus intensity levels based on the intensity level to mining rate power efficiency characteristic of the mining computer (for example, graph 264 of FIG. 10), the valuation of the cryptocurrency, and the cost of electric power as described above.

Power coordinator 112 may adjust the intensity level of different mining computers 106 of cryptocurrency miner 104 to different levels. For example, power coordinator 112 may adjust the intensity level of a first mining computer from 100% to 90% of its maximum intensity level and adjust the intensity level of a second mining computer from 100% to 80% of its maximum intensity level. Adjusting the intensity levels of the mining computers to different levels may reduce the power consumption of the mining computers by different amounts. For example, the power consumption of the first mining computer may be reduced from 100% to 82% of its maximum power consumption value and the power consumption of the second mining computer may be reduced from 100% to 68% of its maximum power consumption value. The maximum power consumption value of the first and second mining computers may be same or different.

Adjusting the intensity levels of mining computers 106 by reducing power consumption may also reduce the mining rate and increase the mining rate power efficiency (for example, as shown in graphical representation 252 of FIG. 10). Similarly, adjusting the intensity levels of mining computers 106 by increasing power consumption may also increase the mining rate and reduce the mining rate power efficiency. In some cases, a mining computer 106 may be powered off instead of being operated at a low intensity level (e.g., where better mining revenue yields are possible by allocating all available mining power to the other mining computers 106).

In cases where the mining power availability is less than the maximum miner power draw, one or more mining computers 106 of cryptocurrency miner 104 may be operated at an intensity level less than the corresponding maximum intensity level. Power coordinator 112 may operate higher efficiency mining computers 106 at higher intensity levels compared with lower efficiency mining computers 106 to generate a higher total cryptocurrency mining revenue yield. As described herein above, an intensity level to computer depreciation characteristic may be used to describe the change in mining rate power efficiency characteristic (and consequently cryptocurrency mining revenue yield) of mining computer 106 with age. Power coordinator may adjust the intensity levels of mining computers 106 based on the intensity level to mining rate power efficiency characteristic of the mining computer, the valuation of the cryptocurrency, the cost of electric power, and the intensity level to computer depreciation characteristic of the mining computer. In some examples, mining computers of greater age may be operated at lower intensity levels because the peak of the cryptocurrency mining revenue yield may have shifted to lower intensity levels. This may enable the productive use of older mining computers that may have low or even negative cryptocurrency mining revenue yields at higher intensity levels (but that still have positive cryptocurrency mining revenue yields at lower intensity levels).

In some embodiments, there may be a time delay associated with adjustment of intensity levels of mining computers 106. For example, the mining computers may need to be rebooted to change the intensity level of the mining computer from an initial intensity level to a new intensity level and there may be a time delay associated with rebooting the mining computers. The time delay can be, for example, 1 to 5 minutes. For an example scenario where power coordinator 112 determines new intensity levels and initiates adjustment of intensity levels for all mining computers 106 simultaneously, the power consumption would briefly reduce to zero and not fully resume mining at the new intensity until the end of the time delay. As such that there can be unused available power during the time delay associated with the adjustment of the intensity levels. The unused available power can cause a reduction in total revenue yield. Power coordinator 112 may implement a staggered adjustment of intensity levels of mining computers 106 to enable greater utilisation of available power during adjustment of intensity levels while avoiding exceeding the determined available power consumption for mining.

In some embodiments, power coordinator 112 may perform a staggered adjustment of intensity levels of mining computers 106. For example, an EV may be connected to EV charger 108 for charging, thereby causing a reduction in mining power availability. In response, power coordinator 112 may perform a staggered adjustment of intensity levels of mining computers 106 (as opposed to adjusting the intensity level of all the mining computers simultaneously) from an initial intensity level to a reduced intensity level. Power coordinator 112 may initiate a staggered adjustment of intensity levels by first adjusting the intensity levels of an initial portion (e.g., one or more, but not all) of mining computers 106. The initial portion of mining computers 106 can be any suitable portion based on factors including the total adjustment required to the intensity levels and the time delay associated with adjustment of the intensity levels. For example, the initial portion can be between 1 mining computer 106 and 50% of mining computers 106. In other examples, the initial portion can be a different percentage of mining computers 106.

The total power consumption of mining computers 106 can initially decrease as the initial portion of mining computers begin rebooting (while the remaining portion of mining computers continue operating at their pre-existing intensity levels). As the initial portion of mining computers 106 reboot and ramp up to their new intensity levels, the total power consumption of mining computers 106 may ramp up and approach the available mining power level. In response, power coordinator 112 may sequentially initiate adjustment of the intensity levels of the remaining portion of mining computers 106 that were still operating at their initial intensity levels. Each sequential adjustment may include adjustment of intensity levels of between one and all remaining mining computers simultaneously. Power coordinator 112 can continue the sequential adjustments of the intensity levels of the mining computers until all mining computers are adjusted to their new intensity levels. For example, the number of staggered (i.e., non-simultaneous) adjustments by power coordinator 112 may be between 2 and the number of mining computers 106.

As the EV charging progresses, the power draw of EV charger 108 may begin decreasing and the mining power availability can thereby begin increasing. In response, power coordinator 112 may sequentially adjust the intensity levels of mining computers 106 to increase utilization of the power available for cryptocurrency mining. Power coordinator 112 may begin the sequential adjustment of intensity levels based on factors including the charging characteristics of EVs and/or time delay associated with adjustment of intensity levels of mining computers 106. In some embodiments, power coordinator 112 may being the sequential adjustment of intensity levels in response to the EV being charged to a threshold level. For example, power coordinator 112 may being the sequential adjustment of intensity levels in response to the EV being charged to a threshold level of total power (e.g., 75% of total power or any other suitable percentage of total power). In some embodiments, power coordinator 112 may being the sequential adjustment of intensity levels based on a predicted power draw of EV charger 108. For example, power coordinator 112 may determine a parameter associated with the power draw of EV charger 108 during charging of an EV (e.g., a slope of the power curve). Power coordinator 112 may use the determined parameter to predict a power draw of EV charger 108 and the future time when additional power for cryptocurrency becomes available. Power coordinator 112 may initiate adjustment of intensity levels of one or more mining computers 106 at a time that is one time delay earlier than the future time when additional power becomes available. This may enable optimal utilization of power available for cryptocurrency mining and may provide higher mining revenue yield.

Figure 12:
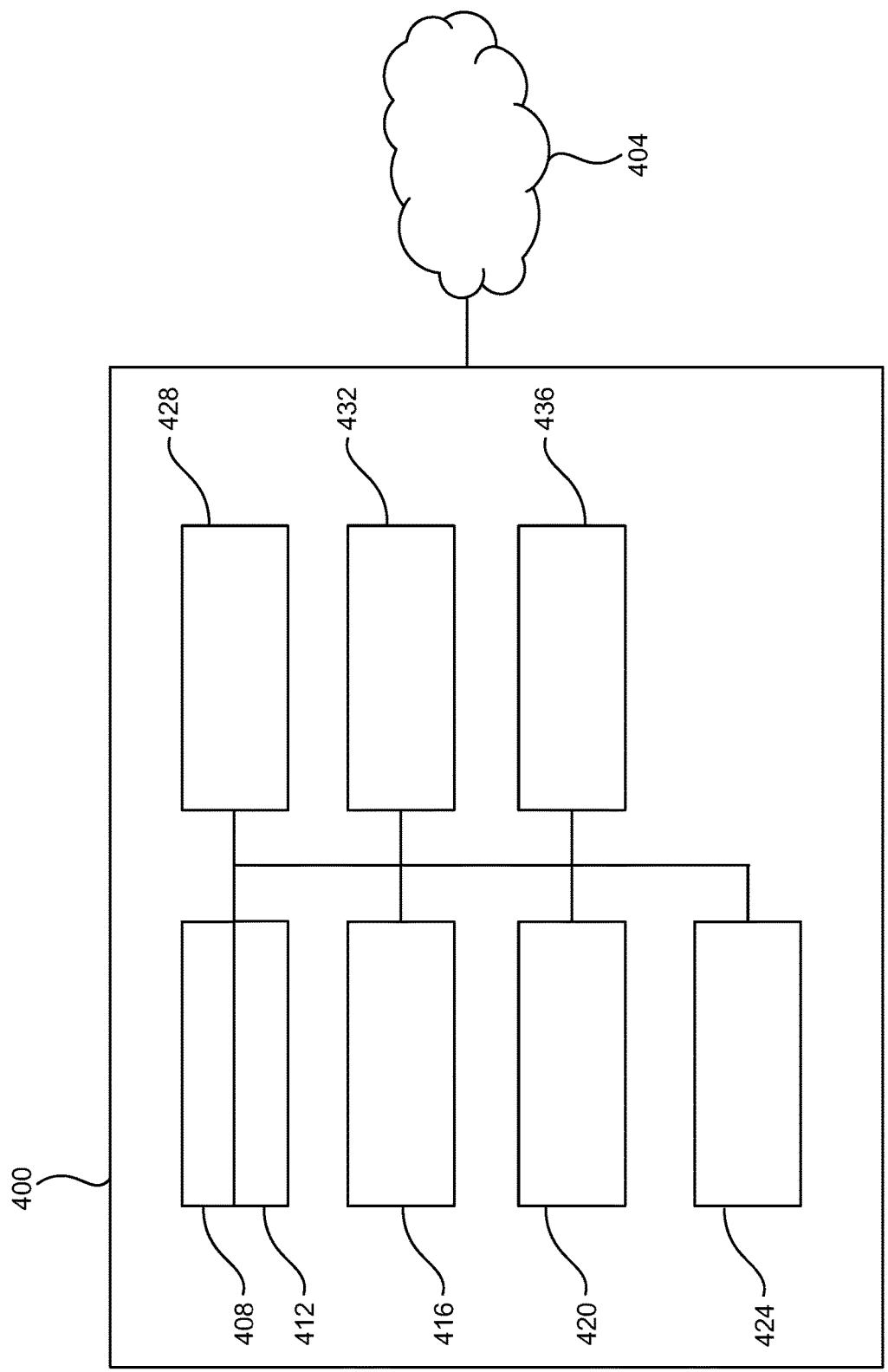
FIG. 12 is a schematic illustration of a device for use with any of the hybrid apparatuses of FIGS. 1 to 6.

Referring now to FIG. 12, shown therein is a schematic illustration of device 400. As shown, device 400 is generally illustrated as having hardware components, which may represent the configuration of one or more of the elements of power coordinator 112 (shown in FIGS. 1 to 6). In at least one embodiment, device 400 includes a connection with a network 404 such as a wired or wireless connection to the Internet or to a private network (e.g., a private network including components of hybrid apparatus 100 shown in FIGS. 1 to 6). In some cases, network 404 includes other types of computer or telecommunication networks.

In the example shown, device 400 includes a memory 408, an application 412, an output device 416, a display device 420, a secondary storage device 424, a processor 428, an input device 432, and a communication device 436. In some embodiments, device 400 includes multiple of any one or more of memory 408, application 412, output device 416, display device 420, secondary storage device 424, processor 428, input device 432, and communication device 436. In some embodiments, device 400 does not include one or more of applications 412, secondary storage devices 424, network connections, input devices 432, output devices 416, display devices 420, and communication devices 436.

Memory 408 can include random access memory (RAM) or similar types of memory. Also, in some embodiments, memory 408 stores one or more applications 412 for execution by processor 428. Applications 412 correspond with software modules including computer executable instructions to perform processing for the functions and methods described herein. Secondary storage device 424 can include a hard disk drive, floppy disk drive, CD drive, DVD drive, Blu-ray drive, solid state drive, flash memory or other types of non-volatile data storage.

In some embodiments, device 400 stores information in a remote storage device, such as cloud storage, accessible across a network, such as network 404 or another network. In some embodiments, device 400 stores information distributed across multiple storage devices, such as memory 408 and secondary storage device 424 (i.e., each of the multiple storage devices stores a portion of the information and collectively the multiple storage devices store all of the information). Accordingly, storing data on a storage device as used herein and in the claims, means storing that data in a local storage device, storing that data in a remote storage device, or storing that data distributed across multiple storage devices, each of which can be local or remote.

Input device 432 can include any device for entering information into device 400. For example, input device 432 can be a keyboard, keypad, cursor-device, touchscreen, camera, or microphone. Input device 432 can also include input ports and wireless radios (e.g., Bluetooth®, or 802.11x) for making wired and wireless connections to external devices (e.g., tablets, smartphones etc.).

Display device 420 can include any type of device for presenting visual information. For example, display device 420 can be a computer monitor, a flat-screen display, a projector or a display panel.

Output device 416 can include any type of device for presenting a hard copy of information, such as a printer for example. Output device 416 can also include other types of output devices such as speakers, for example. In at least one embodiment, output device 416 includes one or more of output ports and wireless radios (e.g., Bluetooth®, or 802.11x) for making wired and wireless connections to external devices.

Communication device 436 can have any design suitable to receive analog and/or digital inputs from, and to provide analog and/or digital outputs to components of hybrid apparatus 100 (shown in FIGS. 1 to 6). In some embodiments, communication device 436 may include separate modules for analog and digital signals.

Processor 428 may be any device that can execute applications, computer readable instructions or programs. The applications, computer readable instructions or programs can be stored in memory 408 or in secondary storage 424, or can be received from remote storage accessible through network 404, for example. When executed, the applications, computer readable instructions or programs can configure the processor 428 (or multiple processors 428, collectively) to perform, for example, the acts described herein with reference to power coordinator 112 (FIGS. 1 to 6).

FIG. 12 illustrates one example hardware schematic of a device 400. In alternative embodiments, device 400 contains fewer, additional or different components. In addition, although aspects of an implementation of device 400 are described as being stored in memory, one skilled in the art will appreciate that these aspects can also be stored on or read from other types of computer program products or computer-readable media, such as secondary storage devices, including hard disks, floppy disks, CDs, or DVDs; a carrier wave from the Internet or other network; or other forms of RAM or ROM. Some embodiments include non-transitory computer-readable medium storing computer-readable instructions that when executed configure a processor to perform methods described herein.

Figure 13:
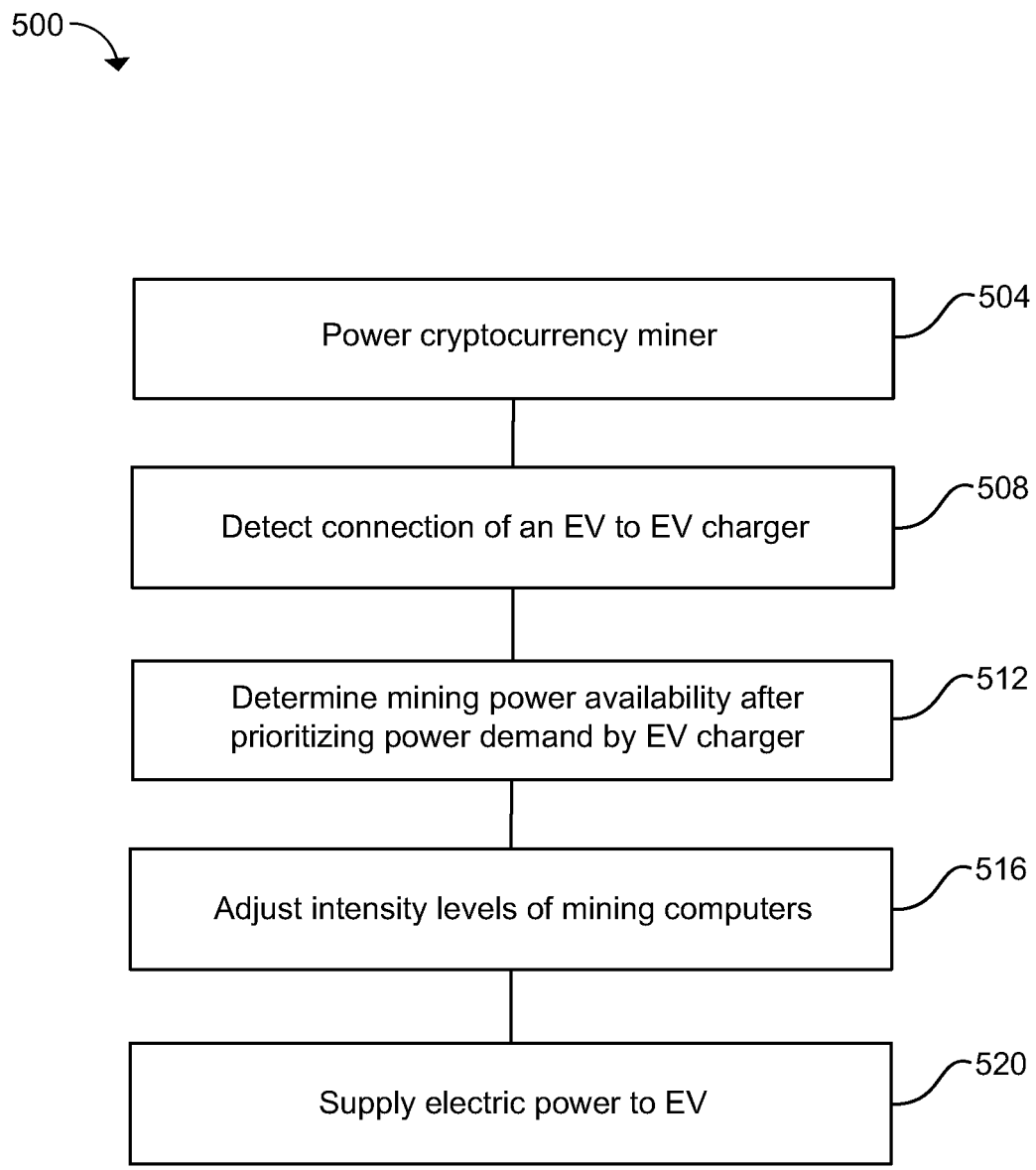
FIG. 13 is a flowchart illustrating an example method of coordinating power between an EV charger and a cryptocurrency miner, in accordance with an embodiment.

Reference is now made to FIGS. 1, 2, 4, 5, and 13. FIG. 13 shows a flowchart illustrating an example method 500 of coordinating power between an EV charger and a cryptocurrency miner. For example, method 500 may be executed for coordinating power between EV charger 108 and cryptocurrency miner 104 of hybrid apparatus 100. Method 500 may be performed at various times, for example each time an EV is connected to hybrid apparatus 100 for charging.

At step 504, the cryptocurrency miner 104 may be supplied with electric power from electric power input 116. The cryptocurrency miner may have multiple cryptocurrency mining computers and a maximum miner power draw. For example, cryptocurrency miner 104 having multiple mining computers 106 may be powered at step 504. The mining computers may have an adjustable intensity level. The maximum miner power draw may be associated with the multiple cryptocurrency mining computers each operating at their respective highest intensity levels. Step 504 may include cryptocurrency miner 104 operating at the maximum miner power draw or less than this maximum.

At step 508, the connection of an electric vehicle to the electric vehicle charger may be detected. For example, the connection of EV 10 to EV charger 108 may be detected. The connection may be associated with a vehicle charging power demand.

At step 512, a power coordinator may determine mining power availability for the cryptocurrency miner after prioritizing power demand by the EV charger. For example, power coordinator 112 may determine mining power availability for cryptocurrency miner 104 after prioritizing power demand by EV charger 108. In some examples, the mining power availability may be less than 70% of the maximum miner power draw.

Optionally, at step 512, the power coordinator may receive a target furnace heating level. For example, power coordinator 112 may receive a target furnace heating level in embodiments where the cryptocurrency miner provides functionalities including space heater functionalities. Power coordinator may determine a target power consumption level of mining computers 106 based on the target furnace heating level up to a maximum of the mining power availability after prioritizing power demand by EV charger 108.

At step 516, the power coordinator may direct the cryptocurrency miner to continue mining cryptocurrency by adjusting the intensity levels of the mining computers such that the cryptocurrency miner consumes not more than the mining power availability. For example, power coordinator 112 may direct cryptocurrency miner 104 to continue mining cryptocurrency by adjusting the intensity levels of mining computers 106 such that cryptocurrency miner 104 consumes not more than the mining power availability. Power coordinator 112 may select the intensity levels to maximize cryptocurrency mining revenue yield as described above. The intensity levels of mining computers 106 may be adjusted simultaneously or in a staggered fashion (as described above). In some embodiments, the intensity levels of mining computers 106 may also be adjusted based on a predicted power draw of the EV charger. For example, power coordinator 112 may determine a predicted power draw of EV charger 108, the future time when additional power for cryptocurrency miner 104 becomes available and initiate adjustment of intensity levels of mining computers 106 accordingly.

Optionally, if a target power consumption level determined at step 512 exceeds the mining power availability, the power coordinator may adjust the intensity levels of mining computers such that the cryptocurrency miner consumes not more than the mining power availability. If the target power consumption level does not exceed the mining power availability, the power coordinator may adjust the intensity levels of mining computers such that the cryptocurrency miner consumes not more than the target power consumption level. The power coordinator may adjust the intensity levels of the mining computers such that a total revenue yield of all the mining computers is maximized while total power consumption of the mining computers does not exceed the corresponding threshold (mining power availability and/or target power consumption level based on target furnace heating level).

At step 520, electric power may be supplied to the EV, via the EV charger, in response to the vehicle charging power demand. For example, hybrid apparatus 100 may supply electric power to EV 10 via EV charger 108, in response to the vehicle charging power demand.

While the above description provides examples of the embodiments, it will be appreciated that some features and/or functions of the described embodiments are susceptible to modification without departing from the spirit and principles of operation of the described embodiments. Accordingly, what has been described above has been intended to be illustrative of the invention and non-limiting and it will be understood by persons skilled in the art that other variants and modifications may be made without departing from the scope of the invention as defined in the claims appended hereto. The scope of the claims should not be limited by the preferred embodiments and examples, but should be given the broadest interpretation consistent with the description as a whole.

Items

Item 1: A hybrid apparatus for charging electric vehicles and mining cryptocurrency, the apparatus comprising:
an electric power input associated with a rated maximum power capacity; an electric vehicle charger electrically connected to the electric power input, the electric vehicle charger having at least one vehicle power outlet and a maximum charger power draw from the electric power input, the maximum charger power draw being associated with delivering a maximum charger output to the at least one vehicle power outlet and being less than the rated maximum power capacity;
a cryptocurrency miner electrically connected to the electric power input,
the cryptocurrency miner having multiple cryptocurrency mining computers and a maximum miner power draw from the electric power input,
each mining computer having an adjustable intensity level, the maximum miner power draw being associated with the multiple cryptocurrency mining computers each operating at their respective highest intensity level,
the maximum miner power draw being less than the rated maximum power capacity; and
a power coordinator configured to determine mining power availability within the rated maximum power capacity after prioritizing power demand by the electric vehicle charger, and to direct the cryptocurrency miner to continue mining cryptocurrency by adjusting the intensity levels of the mining computers such that the cryptocurrency miner consumes not more than the mining power availability, wherein the rated maximum power capacity is between 40% and 80% of a sum of the maximum charger power draw and the maximum miner power draw.

Item 2: The apparatus of any preceding item, wherein said adjusting the intensity levels comprises adjusting one or more of an operating frequency, voltage, power, and temperature of the mining computers.

Item 3: The apparatus of any preceding item, wherein the multiple cryptocurrency mining computers includes a first mining computer and a second mining computer, and said adjusting the intensity level comprises:
adjusting the intensity level of the first mining computer to a first intensity level; and
adjusting the intensity level of the second mining computer to a second intensity level different from the first intensity level.

Item 4: The apparatus of any preceding item, wherein the multiple cryptocurrency mining computers include a first mining computer and a second mining computer, and said adjusting the intensity level comprises:
reducing a power consumption of the first mining computer by a first percentage; and
reducing a power consumption of the second mining computer by a second percentage different from the first percentage.

Item 5: The apparatus of any preceding item, wherein each of the first mining computer and the second mining computer has a mining rate, and a maximum mining rate of the first mining computer at the highest intensity level of the first mining computer is less than 75% of a maximum mining rate of the second mining computer at the highest intensity level of the second mining computer.

Item 6: The apparatus of any preceding item, wherein said adjusting the intensity levels comprises staggering adjustment of the intensity levels of one or more of the multiple cryptocurrency mining computers based on a time delay associated with effecting a change to the intensity levels.

Item 7: The apparatus of any preceding item, wherein said staggering comprises initiating adjustment of the intensity levels of one or more of the multiple cryptocurrency mining computers based on the time delay and a predicted power draw of the electric vehicle charger.

Item 8: The apparatus of any preceding item, wherein
the cryptocurrency miner is a cryptocurrency mining furnace having a building heat outlet duct thermally coupled to heat generated by the cryptocurrency mining computers,
the power coordinator is further configured to receive a target furnace heating level, and
adjusting the intensity levels of the mining computers comprises adjusting the intensity levels of the mining computers such that the cryptocurrency mining furnace operates at no higher than the target furnace heating level.

Item 9: The apparatus of any preceding item, wherein said adjusting the intensity level comprises reducing power consumption and mining rate of the cryptocurrency miner and increasing a mining rate power efficiency of the cryptocurrency miner.

Item 10: The apparatus of any preceding item, wherein said adjusting the intensity level comprises increasing power consumption and mining rate of the cryptocurrency miner and decreasing a mining rate power efficiency of the cryptocurrency miner.

Item 11: The apparatus of any preceding item, wherein said adjusting the intensity level comprises selecting an adjusted intensity level for each of the mining computers based on an intensity level to mining rate power efficiency characteristic of the mining computer, a valuation of the cryptocurrency, and a cost of electric power.

Item 12: The apparatus of any preceding item, wherein said adjusting the intensity level comprises selecting an adjusted intensity level for each of the mining computers based on an intensity level to mining rate power efficiency characteristic of the mining computer, a valuation of the cryptocurrency, a cost of electric power, and an intensity level to computer depreciation characteristic of the mining computer.

Item 13: The apparatus of any preceding item, wherein the cryptocurrency miner is a cryptocurrency mining furnace having a driveway heat outlet duct thermally coupled to heat generated by the cryptocurrency mining computers.

Item 14: The apparatus of any preceding item, further comprising a driveway heating duct connectable to the driveway heat outlet duct.

Item 15: A mesh network system of cryptocurrency mining furnaces, comprising:
at least three cryptocurrency mining furnaces including a first, second, and third cryptocurrency mining furnace, each cryptocurrency mining furnace having multiple cryptocurrency mining computers, a building heat outlet duct thermally coupled to heat generated by the mining computers and a wireless radio,
the first cryptocurrency mining furnace having a network interface card having a network wire connector supporting connectivity to an internet source to exchange cryptocurrency mining data,
the wireless radio of the first cryptocurrency mining furnace supporting interconnectivity with the second and third cryptocurrency mining furnaces;
the second cryptocurrency mining furnace configured to exchange cryptocurrency mining data with the network interface card by way of the wireless radios of the first and second cryptocurrency mining furnaces; and
the third cryptocurrency mining furnace configured to exchange cryptocurrency mining data with the network interface card by way of the wireless radios of the first, second, and third cryptocurrency mining furnaces.

Item 16: A cryptocurrency mining furnace comprising:
an electric power input;
a cryptocurrency miner electrically connected to the electric power input, the cryptocurrency miner having multiple cryptocurrency mining computers, each mining computer having an adjustable intensity level; and
a power coordinator configured to: receive a target furnace heating level, and adjust the intensity levels of the mining computers such that the cryptocurrency mining furnace operates at no higher than the target furnace heating level.

Item 17: The cryptocurrency mining furnace of any preceding item further comprising a building heat outlet duct thermally coupled to heat generated by the cryptocurrency mining computers.

Item 18: The cryptocurrency mining furnace of any preceding item, wherein the cryptocurrency miner is instead an AI server for performing one or more AI processing tasks.

Item 19: The cryptocurrency mining furnace of any preceding item, wherein
the electric power input is associated with a rated maximum power capacity;
the cryptocurrency miner having a maximum miner power draw from the electric power input, the maximum miner power draw being associated with the multiple cryptocurrency mining computers each operating at their respective highest intensity level; and
the power coordinator is further configured to: determine mining power availability within the rated maximum power capacity, and direct the cryptocurrency miner to continue mining cryptocurrency by adjusting the intensity levels of the mining computers such that the cryptocurrency miner consumes not more than the mining power availability.

Item 20: A method of coordinating power between an electric vehicle charger and a cryptocurrency miner, the method comprising:
powering the cryptocurrency miner, wherein the cryptocurrency miner has multiple cryptocurrency mining computers and a maximum miner power draw, each mining computer having an adjustable intensity level, the maximum miner power draw being associated with the multiple cryptocurrency mining computers each operating at their respective highest intensity level;
detecting connection of an electric vehicle to the electric vehicle charger, the connection associated with a vehicle charging power demand;
determining, by a power coordinator, mining power availability for the cryptocurrency miner after prioritizing power demand by the electric vehicle charger,
wherein the mining power availability is less than 70% of the maximum miner power draw; directing, by the power coordinator, the cryptocurrency miner to continue mining cryptocurrency by adjusting the intensity levels of the mining computers such that the cryptocurrency miner consumes not more than the mining power availability; and supplying electric power to the electric vehicle, via the electric vehicle charger, in response to the vehicle charging power demand.

Item 21: The method of any preceding item, wherein said adjusting the intensity levels comprises adjusting one or more of an operating frequency, voltage, power, and temperature of the mining computers.

Item 22: The method of any preceding item, wherein
the multiple cryptocurrency mining computers includes a first mining computer and a second mining computer, and
said adjusting the intensity level comprises:
adjusting the intensity level of the first mining computer to a first intensity level; and
adjusting the intensity level of the second mining computer to a second intensity level different from the first intensity level.

Item 23: The method of any preceding item, wherein
the multiple cryptocurrency mining computers include a first mining computer and a second mining computer, and
said adjusting the intensity level comprises:
reducing a power consumption of the first mining computer by a first percentage; and
reducing a power consumption of the second mining computer by a second percentage different from the first percentage.

Item 24: The method of any preceding item, wherein
the cryptocurrency miner is a cryptocurrency mining furnace having a building heat outlet duct thermally coupled to heat generated by the cryptocurrency mining computers,
the method further comprises receiving, by the power coordinator, a target furnace heating level, and
adjusting the intensity levels of the mining computers comprises adjusting the intensity levels of the mining computers such that the cryptocurrency mining furnace operates at no higher than the target furnace heating level.

Item 25: The method of any preceding item, wherein said adjusting the intensity level comprises reducing power consumption and mining rate of the cryptocurrency miner and increasing a mining rate power efficiency of the cryptocurrency miner.

Item 26: The method of any preceding item, wherein said adjusting the intensity level comprises increasing power consumption and mining rate of the cryptocurrency miner and decreasing a mining rate power efficiency of the cryptocurrency miner.

Item 27: The method of any preceding item, wherein said adjusting the intensity level comprises selecting an adjusted intensity level for each of the mining computers based on an intensity level to mining rate power efficiency characteristic of the mining computer, a valuation of the cryptocurrency, and a cost of electric power.

Item 28: The method of any preceding item, wherein said adjusting the intensity level comprises selecting an adjusted intensity level for each of the mining computers based on an intensity level to mining rate power efficiency characteristic of the mining computer, a valuation of the cryptocurrency, a cost of electric power, and an intensity level to computer depreciation characteristic of the mining computer.

Item 29: The method of any preceding item, wherein said adjusting the intensity levels comprises staggering adjustment of the intensity levels of one or more of the multiple cryptocurrency mining computers based on a time delay associated with effecting a change to the intensity levels.

Item 30: The method of any preceding item, wherein said staggering comprises initiating adjustment of the intensity levels of one or more of the multiple cryptocurrency mining computers based on the time delay and a predicted power draw of the electric vehicle charger.

Item 31: A non-transitory computer readable medium storing thereon program instructions that are executable by a processor for performing a method according to any one of the preceding items.

Item 32: A method of controlling power draw of a cryptocurrency miner, the method comprising:
powering the cryptocurrency miner, wherein the cryptocurrency miner has multiple cryptocurrency mining computers and a maximum miner power draw, each mining computer having an adjustable intensity level, the maximum miner power draw being associated with the multiple cryptocurrency mining computers each operating at their respective highest intensity level;
receiving an input indicating a change in a mining power availability to the cryptocurrency miner;
directing the cryptocurrency miner to continue mining cryptocurrency by adjusting the intensity levels of the mining computers such that the cryptocurrency miner consumes not more than the mining power availability;
receiving a target value for the power draw of the cryptocurrency miner; and
adjusting an intensity level of each of the multiple cryptocurrency mining computers such that the power draw of the cryptocurrency miner does not exceed the target value.

Item 33: The method of any of preceding item, wherein said adjusting the intensity level of each of the multiple cryptocurrency mining computers comprises a plurality of sequentially performed adjustments over a period of time, each adjustment including adjusting the intensity level for a different subset of the multiple cryptocurrency mining computers, the power draw of the cryptocurrency miner not exceeding the target value during the period of time.

Item 34: A method of coordinating power for a cryptocurrency mining furnace, the method comprising:
powering the cryptocurrency miner, wherein the cryptocurrency miner has multiple cryptocurrency mining computers and a maximum miner power draw,
each mining computer having an adjustable intensity level, the maximum miner power draw being associated with the multiple cryptocurrency mining computers each operating at their respective highest intensity level;
receiving, by a power coordinator, a target furnace heating level, and
adjusting, by the power coordinator, the intensity levels of the mining computers such that the cryptocurrency mining furnace operates at no higher than the target furnace heating level.

Item 35: The method of any preceding item, further comprising outputting heat generated by the cryptocurrency mining computers through a building heat outlet duct.

Item 36: The method of any preceding item, wherein
the electric power input is associated with a rated maximum power capacity; and
the method further comprises:
determining, by the power coordinator, a mining power availability within the rated maximum power capacity, and directing, by the power coordinator, the cryptocurrency miner to continue mining cryptocurrency by adjusting the intensity levels of the mining computers such that the cryptocurrency miner consumes not more than the mining power availability.

Item 37: The method of any preceding item, wherein said adjusting the intensity levels comprises adjusting one or more of an operating frequency, voltage, power, and temperature of the mining computers.

Item 38: The method of any preceding item, wherein the multiple cryptocurrency mining computers includes a first mining computer and a second mining computer, and said adjusting the intensity level comprises: adjusting the intensity level of the first mining computer to a first intensity level; and adjusting the intensity level of the second mining computer to a second intensity level different from the first intensity level.

Item 39: The method of any preceding item, wherein said adjusting the intensity levels comprises staggering adjustment of the intensity levels of one or more of the multiple cryptocurrency mining computers based on a time delay associated with effecting a change to the intensity levels.

Item 40: The method of any preceding item, wherein said staggering comprises initiating adjustment of the intensity levels of one or more of the multiple cryptocurrency mining computers based on the time delay and a predicted power draw of the electric vehicle charger.

Item 41: The method of any preceding item, wherein said adjusting the intensity level comprises reducing power consumption and mining rate of the cryptocurrency miner and increasing a mining rate power efficiency of the cryptocurrency miner.

Item 42: A non-transitory computer readable medium storing thereon program instructions that are executable by a processor for performing a method according to any preceding item.

We claim:

1. A cryptocurrency mining furnace comprising:
   an electric power input;
   a cryptocurrency miner electrically connected to the electric power input, the cryptocurrency miner having multiple cryptocurrency mining computers including at least a first mining computer and a second mining computer, each mining computer having an adjustable intensity level; and
   a power coordinator configured to:
      receive a target furnace heating level, and
      direct the cryptocurrency miner to continue mining cryptocurrency using each of the cryptocurrency mining computers by adjusting the intensity level of each of the mining computers such that the cryptocurrency mining furnace operates at no higher than the target furnace heating level,
      wherein said adjusting the intensity level of each of the cryptocurrency mining computers comprises adjusting at least one of an operating frequency and voltage of each of the cryptocurrency mining computers, and
      wherein said adjusting the intensity level comprises:
         adjusting the intensity level of the first mining computer to a first intensity level, and
         adjusting the intensity level of the second mining computer to a second intensity level different from the first intensity level.

2. The cryptocurrency mining furnace of claim 1 further comprising a building heat outlet duct thermally coupled to heat generated by the cryptocurrency mining computers.

3. The cryptocurrency mining furnace of claim 1, wherein:
   the electric power input is associated with a rated maximum power capacity;
   the cryptocurrency miner having a maximum miner power draw from the electric power input, the maximum miner power draw being associated with the multiple cryptocurrency mining computers each operating at their respective highest intensity level; and
   the power coordinator is further configured to:
      determine mining power availability within the rated maximum power capacity, and
      direct the cryptocurrency miner to continue mining cryptocurrency by adjusting the intensity levels of the mining computers such that the cryptocurrency miner consumes not more than the mining power availability.

4. The cryptocurrency mining furnace of claim 1, wherein said adjusting the intensity levels further comprises adjusting one or more of power and temperature of the cryptocurrency mining computers.

5. The cryptocurrency mining furnace of claim 1, wherein said adjusting the intensity level comprises:
   reducing a power consumption of the first mining computer by a first percentage; and
   reducing a power consumption of the second mining computer by a second percentage different from the first percentage.

6. The cryptocurrency mining furnace of claim 1, wherein each of the first mining computer and the second mining computer has a mining rate and a highest intensity level, and a maximum mining rate of the first mining computer at the highest intensity level of the first mining computer is less than 75% of a maximum mining rate of the second mining computer at the highest intensity level of the second mining computer.

7. The cryptocurrency mining furnace of claim 1, wherein said adjusting the intensity levels comprises staggering adjustment of the intensity levels of one or more of the multiple cryptocurrency mining computers based on a time delay associated with effecting a change to the intensity levels.

8. The cryptocurrency mining furnace of claim 1, wherein said adjusting the intensity level comprises reducing power consumption and mining rate of the cryptocurrency miner and increasing a mining rate power efficiency of the cryptocurrency miner.

9. A method of coordinating power for a cryptocurrency mining furnace, the method comprising:
   powering the cryptocurrency miner, wherein the cryptocurrency miner has multiple cryptocurrency mining computers and a maximum miner power draw,
      each mining computer having an adjustable intensity level, the maximum miner power draw being associated with the multiple cryptocurrency mining computers each operating at their respective highest intensity level,
      the multiple cryptocurrency mining computers including at least a first mining computer and a second mining computer;
   receiving, by a power coordinator, a target furnace heating level, and
   adjusting, by the power coordinator, the intensity levels of each of the cryptocurrency mining computers such that the cryptocurrency mining furnace operates at no higher than the target furnace heating level, wherein said adjusting the intensity levels comprises each of the cryptocurrency mining computers continuing to mine cryptocurrency, wherein said adjusting the intensity levels comprises adjusting at least one of an operating frequency and voltage of each of the cryptocurrency mining computers, and wherein said adjusting the intensity level comprises:
  adjusting the intensity level of the first mining computer to a first intensity level, and
  adjusting the intensity level of the second mining computer to a second intensity level different from the first intensity level.

10. The method of claim 9, further comprising outputting heat generated by the cryptocurrency mining computers through a building heat outlet duct.

11. The method of claim 9, wherein
the electric power input is associated with a rated maximum power capacity; and
the method further comprises:
  determining, by the power coordinator, a mining power availability within the rated maximum power capacity, and
  directing, by the power coordinator, the cryptocurrency miner to continue mining cryptocurrency by adjusting the intensity levels of the mining computers such that the cryptocurrency miner consumes not more than the mining power availability.

12. The method of claim 9, wherein said adjusting the intensity levels comprises adjusting one or more of power and temperature of the mining computers.

13. The method of claim 9, wherein said adjusting the intensity levels comprises staggering adjustment of the intensity levels of one or more of the multiple cryptocurrency mining computers based on a time delay associated with effecting a change to the intensity levels.

14. The method of claim 9, wherein said adjusting the intensity level comprises reducing power consumption and mining rate of the cryptocurrency miner and increasing a mining rate power efficiency of the cryptocurrency miner.

15. A non-transitory computer readable medium storing thereon program instructions that are executable by a processor for performing a method according to claim 9.

* * * * *